(12) United States Patent
El-Gamal

(10) Patent No.: US 6,720,817 B2
(45) Date of Patent: Apr. 13, 2004

(54) ALL NPN CLASS-AB LOG-DOMAIN INTEGRATOR WITH SUPPORTING INPUT AND OUTPUT CIRCUITRY FOR LOW-VOLTAGE AND HIGH-FREQUENCY CONTINUOUS-TIME FILTERING

(75) Inventor: Mourad N. El-Gamal, Montreal (CA)

(73) Assignee: McGill University, Montréal (CA)

( * ) Notice: Subject to any disclaimer, the term of this patent is extended or adjusted under 35 U.S.C. 154(b) by 407 days.

(21) Appl. No.: 09/777,939

(22) Filed: Feb. 7, 2001

(65) Prior Publication Data

US 2001/0033191 A1 Oct. 25, 2001

Related U.S. Application Data

(60) Provisional application No. 60/180,668, filed on Feb. 7, 2000.

(51) Int. Cl.[7] .............................................. G06F 7/556
(52) U.S. Cl. ....................... 327/350; 327/341; 327/552; 327/563; 330/257; 330/288; 330/303
(58) Field of Search ................................ 327/336, 341, 327/344, 346, 350, 351, 362, 551–559, 560–568; 330/252, 253, 257, 288, 294, 303, 306

(56) References Cited

U.S. PATENT DOCUMENTS 5,124,666 A * 6/1992 Liu et al. ..................... 330/253
5,325,317 A * 6/1994 Petersen et al. ............. 708/300
5,742,199 A * 4/1998 Shoji et al. .................. 327/552

OTHER PUBLICATIONS

Y. Tsividis, "Externally linear, time–invariant systems and their application to companding signal processors," IEEE Trans. Circuits Syst. II, vol. 44, No. 2, pp. 65–85, Feb. 1997.

Y. Tsividis et al. "Companding in signal processing," Electronic Letters, vol. 26, No. 17, pp. 1331–1332, Aug. 1990.

M. N. El–Gamal and G. W. Roberts, "Very high–frequency log–domain bandpass filters," IEEE Trans. Circuits Syst. II, vol. 45, No. 9, pp. 1188–1198, Sep. 1998.

D. R. Frey, "Log domain filtering for RF applications," IEEE J. Solid–State Circuits, vol. 31, No. 10, pp. 1468–1475, Oct. 1996.

E. Seevinck, "Companding current–mode integrator: A new circuit principle for continuous–time monolithic filters," Electronics Letters, vol. 26, No. 24, pp. 2046–2047, Nov. 1990.

M. Punzenberger and C. C. Enz, "A 1.2 V BiCMOS class AB log–domain filter," ISSCC Dig. Tech. Papers, pp. 56–57, Feb. 1997.

* cited by examiner

Primary Examiner—Timothy P. Callahan
Assistant Examiner—Minh Nguyen
(74) Attorney, Agent, or Firm—Ogilvy Renault; James Anglehart

(57) ABSTRACT

Two variations of a continuous-time instantaneous companding filter are integrated in a 25 GHz bipolar process. Their –3 dB frequencies are tunable in the ranges of 1–30 MHz and 30–100 MHz. The dc gains are controllable up to 10 dB. The measured dynamic ranges for a 1% total harmonic distorsion are 62.5 dB and 50 dB, for the 30 MHz and 100 MHz filters respectively. At maximum cutoff frequencies, the filters dissipate 6.5 mW from a 1.2 V supply. The filters are simple, common-mode interference-resistant, class AB log-domain integrators, suitable for implementation in low-cost bipolar processes. They are suitable for realizing low-voltage filters with reasonable linearity and signal-to-noise ratio. ALL-NPN low distortion input and output interface stages can be added to the integrators. The filters can be used to realized high-frequency programmable filters.

12 Claims, 19 Drawing Sheets

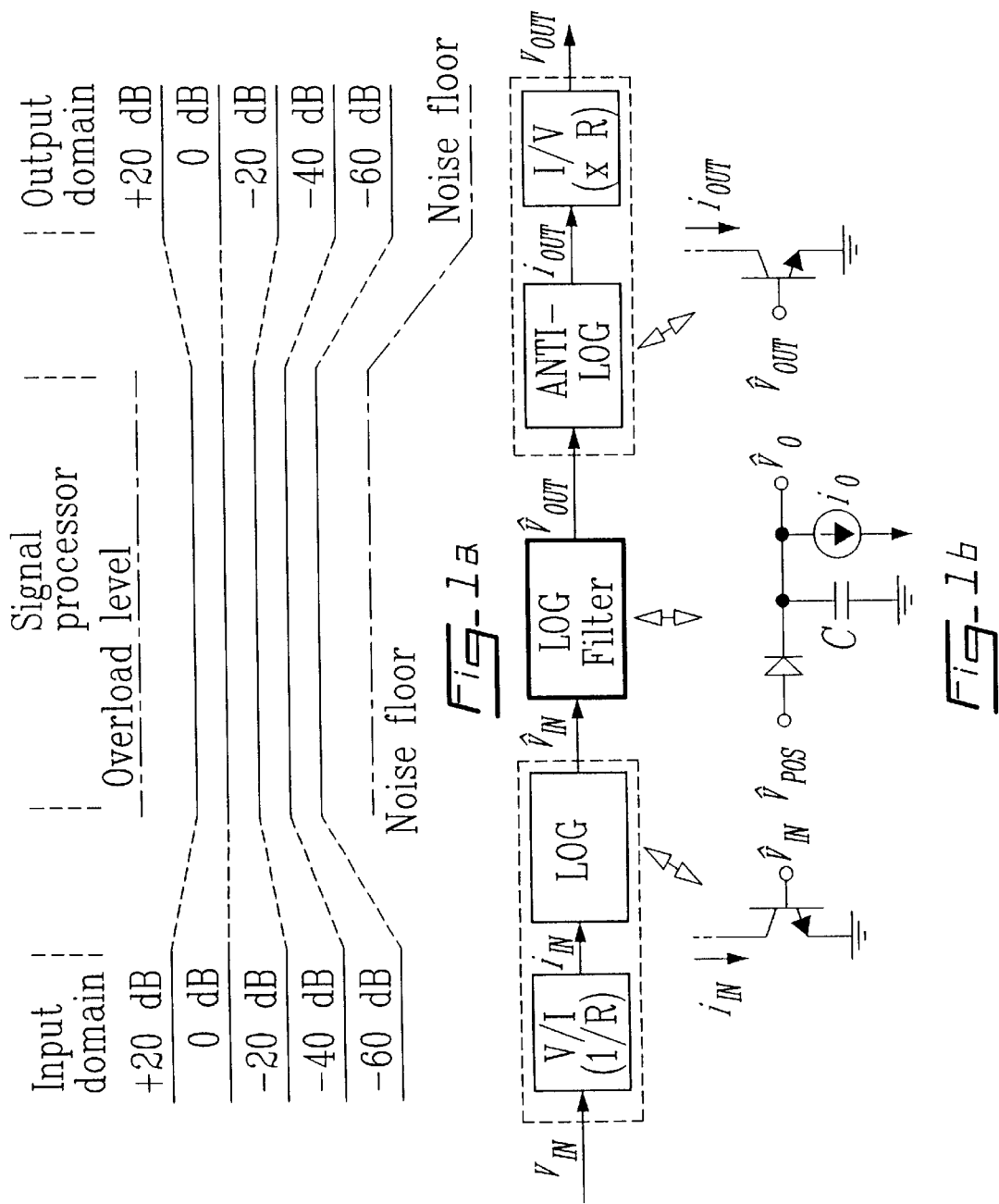

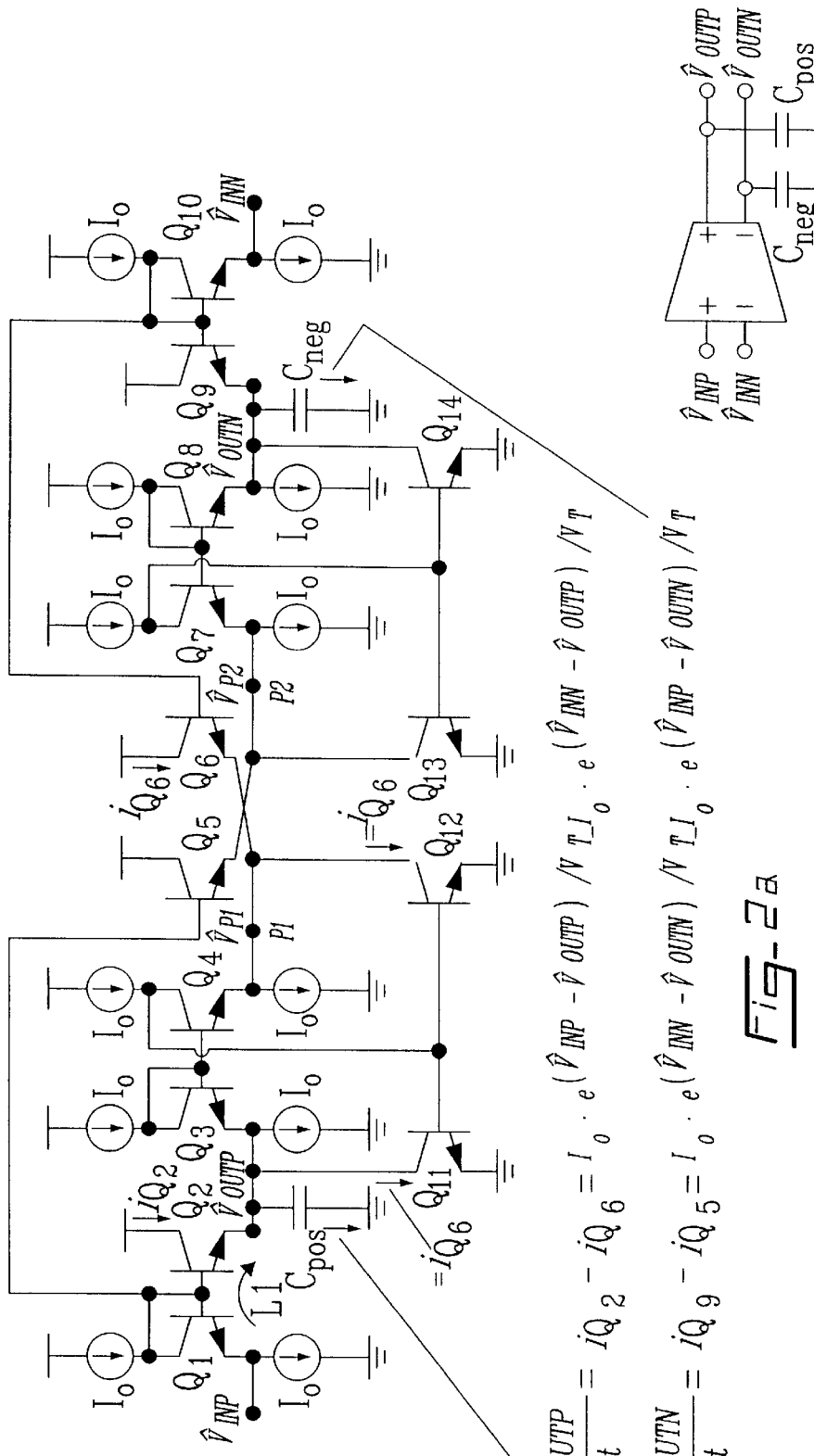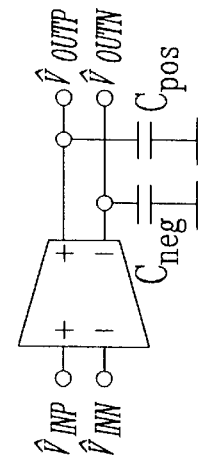

|  | El-Gamal et al. | Punzenberger et al. | 30 MHz filter 1rst embodiment | 100 MHz filter 2nd embodiment |
|---|---|---|---|---|
| Technology | Bipolar array (semi-custom) | 1 μm BiCMOS | Nortel 0.5μm emitter | Nortel 0.5μm emitter |
| NPN's | $f_T=2.5$ GHz, $\beta=130$ | $f_T=6$ GHz, $\beta=80$ | $f_T=25$ GHz, $\beta=75$ | $f_T=25$ GHz, $\beta=75$ |
| PNP's | $f_T=10$ MHz, $\beta=50$ | — | $f_T=200$ MHz, $\beta=12$ | $f_T=200$ MHz, $\beta=12$ |
| Supply voltage ($V_{cc}$) | 1.2V | 1.2V | 1.2V | 1.2V |
| Chip active area (including capacitors) | 2 x 1 tiles (3.2 mm²) | 0.55 mm² | 0.84 mm² | 0.68 mm² |
| Integrating capacitors | 22 and 10 pF (off-chip) | 23.5 and 11.5 pF | 22 and 10 pF | 5 and 2.5 pF |
| Passband ripple | 1.2 dB | 1.0 dB | 1.2 dB | 1.0 dB |
| Bias current $I_0$ (testing condition) | 25 μA | 1 μA | 40 μA | 40 μA |
| Cutoff frequency | 1.5 MHz | 320 kHz | 30 MHz | 100 MHz |
| Total idle output noise current | 52.6 nA rms | 6.3 nA rms | 185 nA rms | 847 nA rms |

Table II

Fig-20A

| | | | |
|---|---|---|---|
| 3rd-order intermod. distort. vs. freq ($I_{test1}+I_{test2}=200$ mA$=5\times I_0$) | — | — | -45.7 dB @ 100 kHz<br>-45.2 dB @ 5 MHz<br>-42.7 dB @ 20 MHz | -42.1 dB @ 100 kHz<br>-58.2 dB @ 15 MHz<br>-42.2 dB @ 75 MHz |
| Dynamic range | 40.5 dB, for 1% HD3 with $I_{test}$ @ 100 kHz | 65.0 dB, for 1% THD with $I_{test}$ @ 1 kHz | 62.5 dB, for 1% THD with $I_{test}$ @ 100 kHz | 50.0 dB, for 1% THD with $I_{test}$ @ 100 kHz |
| Spurious-free dynamic range | 40.4 dB, with $I_{test}$ @ 100 kHz | 46 dB, with $I_{test1}$ @ 99 kHz and $I_{test2}$ @ 101 kHz | 51.0 dB, with $I_{test}$ @ 100 kHz | 43.0 dB, with $I_{test}$ @ 100 kHz |
| Total static power dissipation | 844 µW | 65 µW | 6.5 mW | 6.5 mW |
| Static power dissipation per pole | 282 µW | 22 µW | 2.2 mW | 2.2 mW |
| Power supply rejection ratio (PSRR) vs. frequency | 75 dB @ 1.5 MHz<br>54 dB @ 3.0 MHz | ≈ 55 dB up to 150 kHz,<br>≈ 30 dB @ 320 kHz,<br>for positive supply | ≈ 90 dB up to 3 MHz<br>46 dB @ 30 MHz | 55 dB<PSRR<77 dB up to 50 MHz, and 50 dB @ 100 MHz |
| Gain control | No | No | up to 10 dB | up to 10 dB |
| Frequency tuning($V_{CC}=1.2V$) | 40 kHz–4 MHz | 10 kHz–1 MHz | 1 MHz–30 MHz | 30 MHz–110 MHz |

Table II

Fig-20B

ALL NPN CLASS-AB LOG-DOMAIN INTEGRATOR WITH SUPPORTING INPUT AND OUTPUT CIRCUITRY FOR LOW-VOLTAGE AND HIGH-FREQUENCY CONTINUOUS-TIME FILTERING

CROSS-REFERENCE TO RELATED APPLICATION

The present application claims priority under 35 USC §119(e) of U.S. provisional patent application Ser. No. 60/180,668 filed Feb. 7, 2000.

FIELD OF THE INVENTION

The invention relates to the field of continuous-time integrated circuits filters. More particularly, it relates to an all NPN class-AB log-domain integrator.

BACKGROUND OF THE INVENTION

Companding can be used to maintain reasonable dynamic range (DR) in integrated analog signal processors where the allowable voltage swings are limited by the low-voltage supply requirements of modem low-power applications. Syllabic companding is discussed in Y. Tsividis, "Externally linear, time-invariant systems and their application to companding signal processors," IEEE Trans. Circuits Syst. II, vol. 44, no. 2, pp. 65–85, February 1997. As shown in FIG. 1(a) for the case of syllabic companding, the input signal is compressed before being processed, which ensures signal integrity over a large range of input levels. At the output, the signal is expanded to restore its dynamic range. This can result in a higher DR compared to conventional analog signal processors. Y. Tsividis et al. discuss this issue in "Companding in signal processing," Electronic Letters, vol. 26, no. 17, pp, 1331–1332, August 1990. Unlike the conventional processors) this does not come at the expense of increased power dissipation or chip area for a given bandwidth, Log-domain filters, which constitute a special class of instantaneous companding signal processors are discussed in Y. Tsividis, "Externally linear, time-invariant systems and their application to companding signal processors," IEEE Trans. Circuits Syst. II, vol. 44, no. 2, pp. 65–85, February 1997. They have already been used to realize programmable integrated filters reaching cutoff frequencies up to 220–435 MHz. For example, see M. N. El-Gamal and G. W. Roberts, "Very high-frequency log-domain bandpass filters," IEEE Trans. Circuits Syst. II, vol. 45, no. 9, pp. 1188–1198, September 1998. and D. R. Frey, "Log domain filtering for RF applications," IEEE J. Solid-State Circuits, vol. 31, no. 10, pp. 1468–1475, October 1996. The power consumption of those filters is relatively high due to their 2.7–5 V power supplies, and the dynamic ranges are limited by class A operation. Two low-voltage class AB implementations have already been proposed. The first one is based on the bipolar integrator introduced by Seevinck (See E. Seevinck, "Companding current-mode integrator: A new circuit principle for continuous-time monolithic filters," Electronics Letters, vol. 26, no. 24, pp. 2046–2047, November 1990.), and the second one is the BiCMOS realization proposed by Punzenberger and Enz (See M. Punzenberger and C. C. Enz, "A 1.2 V BiCMOS class AB log-domain filter," ISSCC Dig. Tech. Papers, pp. 56–57, February 1997.). Seevinck's circuit is a good candidate for high-frequency applications, since it employs N-type devices only in the signal path. However, it needs a minimum supply voltage of $\approx 1.7$ V, compared to the 1.2 V requirement of the BiCMOS circuit of Punzenberger and Enz.

There is therefore a need for a 1.2 V bipolar realization which does not employ PMOS or PNP devices in the signal path, making it suitable for VHF applications.

SUMMARY OF THE INVENTION

Accordingly, an object of the present invention is to provide very high-frequency (VHF) and low-voltage continuous-time filters with cutoff frequencies in the 30–100 MHz range, suitable for low-power applications with moderate linearity and SNR specifications (e.g. high-frequency digital communications), and requiring a wide frequency tuning range.

A further object of the present invention, is to propose a simple, common-mode interference-resistant, class AB log-domain integrator, suitable for implementation in low-cost bipolar processes.

Still another object of the present invention, is to make an integrator which is suitable for realizing low-voltage filters with reasonable linearity and SNR with compatible all-NPN low-distortion input and output interface stages.

A further object of the present invention is to realize high-frequency programmable filters.

Two variations of a continuous-time instantaneous companding filter are integrated in a 25 GHz bipolar process. Their −3 dB frequencies are timable in the ranges of 1–30 MHz and 30–100 MHz. The dc gains are controllable up to 10 dB, The measured dynamic ranges for a 1% THD are 62.5 dB and 50 dB, for the 30 MHz and 100 MHz filters respectively. At maximum cutoff frequencies, the filters dissipate 6.5 mW from a 1.2 V supply.

The integrator preferably has the following characteristics:

1. It does not employ p-type transistors (e.g., PNP or PMOS transistors) in the signal path. This has the following two major advantages:

* The integrator maximum operating speed is not limited by the low-frequency p-type devices often provided in IC technologies. It is therefore suitable for high-frequency applications.

*Its implementation and use is not limited to the BiCMOS IC technologies or to the special bipolar IC technologies featuring high-quality PNP transistors. The integrator can therefore be used to implement filters in the many low-cost bipolar technologies available, giving it an edge over other circuits employing p-type devices in the signal path.

2. The integrator does not respond to a common-mode signal applied to its positive and negative input ports simultaneously. This makes it robust against interference, which is a very desirable feature in an IC environment, especially if digital circuitry share the same substrate with the integrator.

3. The integrator can operate from very low supply voltages, as low as 1.2 V. This makes it suitable for low-power applications (e.g. portable devices).

4. It is class-AB: It can therefore handle large signal currents despite of the limited supply voltage. This considerably extends its Dynamic Range (DR) and SNR.

5. It has a logarithmically nonlinear transfer function, making it suitable to be used in implementing the specific class of continuous-time filters called "log-domain filters". The latter are known to result in a high SNR compared to conventional filters.

The first two features discussed above (points 1, and 2.) are unique to the integrator circuit proposed in this invention. This gives it a substantial edge over the state-of-the-art BiCMOS, class-AB, 1.2 V integrator circuit. The latter is limited to the technology it can be used with, i.e. BiCMOS or high quality bipolar, in order to ensure high performance. It is also limited in operating speed: A prototype filter built using this integrator reached a maximum operating speed of only 1 MHz, compared to a similar prototype built with the proposed integrator, which reached a speed of 100 MHz. And finally, the conventional circuitry is more sensitive to interfering signals than the circuit proposed herein.

In addition to the integrator, a new input preprocessing stage is proposed, and a compatible output stage that complements it is also provided such that a complete filter can be implemented. The input stage converts a differential input signal into two "strictly positive" complementary signals. Similar to the integrator, it uses a novel all-NPN circuit that can also operate from a supply voltage as low as 1.2 V.

Accordingly, a first broad aspect of the present invention is to provide a log-domain integrator. The log-domain integrator preferably comprises:

a positive compressed input voltage and a negative compressed input voltage;

a positive compressed output voltage and a negative compressed output voltage;

a ground and a reference voltage;

a first capacitor and a second capacitor;

a first transistor, a second transistor, a third transistor, a fourth transistor, a fifth transistor, a sixth transistor, a seventh transistor, an eighth transistor, a ninth transistor, a tenth transistor, an eleventh transistor, a twelfth transistor, a thirteenth transistor, a fourteenth transistor;

a first current source, a second current source, a third current source, a fourth current source, a fifth current source, a sixth current source, a seventh current source, an eighth current source, a ninth current source, a tenth current source, an eleventh current source, a twelfth current source;

wherein the first capacitor is connected between the negative compressed output voltage and the ground and the second capacitor is connected between the positive compressed output voltage and the ground;

wherein an output of the first current source is connected to a collector of the first transistor, a base of the second transistor, a base of the fifth transistor and a base of the first transistor;

wherein an output of the third current source is connected to a collector of the third transistor, a base of the fourth transistor and a base of the third transistor;

wherein an output of the fifth current source is connected to a collector of the fourth transistor, a base of the eleventh transistor and a base of the twelfth transistor;

wherein an output of the seventh current source is connected to a collector of the seventh transistor, a base of the fourteenth transistor and a base of the thirteenth transistor;

wherein an output of the eleventh current source is connected to a collector of the tenth transistor, a base of the tenth transistor, a base of the sixth transistor and a base of the ninth transistor;

wherein an output of the ninth current source is connected to a collector of the eighth transistor, a base of the seventh collector and a base of the eight collector;

wherein an input of the second current source is connected to the positive compressed input voltage and an emitter of the first transistor;

wherein an input of the twelfth current source is connected to the negative compressed input voltage and an emitter of the tenth transistor;

wherein an input of the fourth current source is connected to an emitter of the third transistor, a collector of the eleventh transistor, an input of the second capacitor, the positive compressed output voltage and an emitter of the second transistor;

wherein an input of the tenth current source is connected to an emitter of the eighth transistor, a collector of the fourteenth transistor, an input of the first capacitor, the negative compressed output voltage and an emitter of the ninth transistor;

wherein an input of the sixth current source is connected to an emitter of the fourth transistor, a collector of the twelfth transistor and an emitter of the sixth transistor;

wherein an input of the eighth current source is connected to an emitter of the seventh transistor, a collector of the thirteenth transistor and an emitter of the fifth transistor;

wherein the ground is connected to an output of the second current source, an emitter of the eleventh transistor, an emitter of the twelfth transistor, an emitter of the thirteenth transistor, an emitter of the fourteenth transistor, an output of the fourth current source, an output of the sixth current source, an output of the eighth current source, an output of the tenth current source, an output of the twelfth current source; and wherein the reference voltage is connected to an input of the first current source., an input of the third current source, an input of the fifth current source, an input of the seventh current source, an input of the ninth current source, an input of the eleventh current source, a collector of the second transistor, a collector of the fifth transistor, a collector of the sixth transistor and a collector of the ninth transistor.

A second broad aspect of the present invention is to provide an input stage for a log-domain integrator comprising a positive half for generating a positive compressed input voltage and a negative half for generating a negative compressed input voltage, the positive and the negative half of the input stage each comprising:

a first dc voltage;

a reference voltage;

a ground;

a linear Voltage-to-Current Converter;

one of a positive uncompressed input voltage and a negative uncompressed input voltage;

a fifteenth current source, a sixteenth current source, a seventeenth current source, an eighteenth current source, a nineteenth current source;

a sixteenth transistor, a seventeenth transistor, an eighteenth transistor, a nineteenth transistor, a twentieth transistor, a twenty-first transistor, a twenty-second transistor, a twenty-third transistor, a twenty-fourth transistor, a twenty-fifth transistor;

wherein the first dc voltage, the reference voltage, the ground and the one of a positive uncompressed input voltage and a negative uncompressed input voltage are connected to the linear Voltage-to-Current Converter;

wherein a first output of the linear Voltage-to-Current Converter is connected to a base of the seventeenth transistor, a base of the twentieth transistor, a base of the twenty-third transistor;

wherein a second output of the linear Voltage-to-Current Converter is connected to an emitter of the sixteenth transistor, a collector of the seventeenth transistor;

wherein the first dc voltage is connected to a base of the nineteenth transistor and a base of the twenty-first transistor;

wherein the reference voltage is connected to a collector of the sixteenth transistor, an input of the fifteenth current source, a collector of the eighteenth transistor an input of the seventeenth current source, a collector of the twenty-second transistor, an input of the nineteenth current source;

wherein the ground is connected to an emitter of the seventeenth transistor, an emitter of the twentieth transistor, an emitter of the twenty-third transistor, an emitter of the twenty-fifth transistor, an output of the sixteenth current source, an output of the eighteenth current source;

wherein an output of the fifteenth current source is connected to a collector of the eighteenth transistor, a base of the eighteenth transistor and a base of the sixteenth transistor;

wherein an emitter of the eighteenth transistor is connected to an input of the sixteenth current source, an emitter of the eighteenth transistor and a collector of the twentieth transistor;

wherein an output of the seventeenth current source is connected to a collector of the twenty-first transistor and a base of the twenty-fifth transistor;

wherein an emitter of the twenty-first transistor is connected to an input of the eighteenth current source, an emitter of the twenty-second transistor, a collector of the twenty-third transistor;

wherein an output of the nineteenth current source is connected to a collector of the twenty-fourth transistor, a base of the twenty-fourth transistor and a base of the twenty-second transistor; and wherein an emitter of the twenty-second transistor is connected to a corresponding one of the positive compressed input voltage and the negative compressed input voltage, respectively, and a collector of the twenty-fifth transistor.

Preferably, the linear Voltage-to-Current Converter comprises:

a thirteenth current source and a fourteenth current source;

a fifteenth transistor;

an input resistor;

wherein the first dc voltage is connected to a base of the fifteenth transistor;

wherein the input resistor is connected between an emitter of the fifteenth transistor and the one of the positive uncompressed input voltage and negative uncompressed input voltage;

wherein the thirteenth current source is connected between the reference voltage and a collector of the fifteenth transistor;

wherein the fourteenth current source is connected between the emitter of the fifteenth transistor and the ground;

wherein the first output of the linear Voltage-to-Current Converter is connected to the collector of the fifteenth transistor; and wherein the second output of the linear Voltage-to-Current Converter is connected to the emitter of the fifteenth transistor.

A third broad aspect of the present invention is to provide an output post-processing stage. The output post-processing stage comprises a positive half for generating a positive uncompressed output voltage and a negative for generating a negative uncompressed output voltage. Each of these half comprises a second dc voltage;

an output resistor;

a twentieth current source, a twenty-first current source, a twenty-second current source;

a twenty-sixth transistor, a twenty-seventh transistor, a twenty-eighth transistor, a twenty-ninth transistor, a thirtieth transistor;

wherein the ground is connected to an output of the twenty-first current source, an emitter of the twenty-eighth transistor, an emitter of the thirtieth transistor;

wherein the reference voltage is connected to an input of the twentieth current source, a collector of the twenty-seventh transistor, an input of the output resistor and an input of the twenty-second current source;

wherein an output of the twentieth current source is connected to a collector of the twenty-sixth transistor, a base of the twenty-sixth transistor and a base of the twenty-seventh transistor;

wherein an emitter of the twenty-sixth transistor is connected to one of the positive compressed output voltage and the negative compressed output voltage and to an input of the twenty-first current source;

wherein an emitter of the twenty-seventh transistor is connected to an emitter of the twenty-ninth transistor and a collector of the twenty-eighth transistor;

wherein an output of the twenty-second current source is connected to a collector of the twenty-ninth transistor, a base of the thirtieth transistor and a base of the twenty-eighth transistor;

wherein the base of the twenty-ninth transistor is connected to the second dc voltage; and wherein an output of the output resistor is connected to a collector of the thirtieth transistor and to a corresponding one of the uncompressed positive output voltage and the uncompressed negative output voltage, respectively.

BRIEF DESCRIPTION OF THE DRAWINGS

These and other features, aspects and advantages of the present invention will be better understood by way of the following description of a preferred embodiment with reference to the accompanying drawings, wherein:

FIG. 1(a) illustrates the concept of companding on the Dynamic Range.

FIG. 1(b) illustrates the principle of log-domain filtering: Example of instantaneous companding.

FIG. 2(a) illustrates a preferred embodiment of the NPN-only Class-AB integrator (do base current compensation not shown for clarity).

FIG. 2(b) illustrates the symbol used for the NPN-only Class-AB integrator of FIG. 2(a).

FIG. 20(a) and FIG. 20(b), form Table II, a comparison table of the performance of two class A filters.

DETAILED DESCRIPTION OF THE PREFERRED EMBODIMENT

Figure 3:
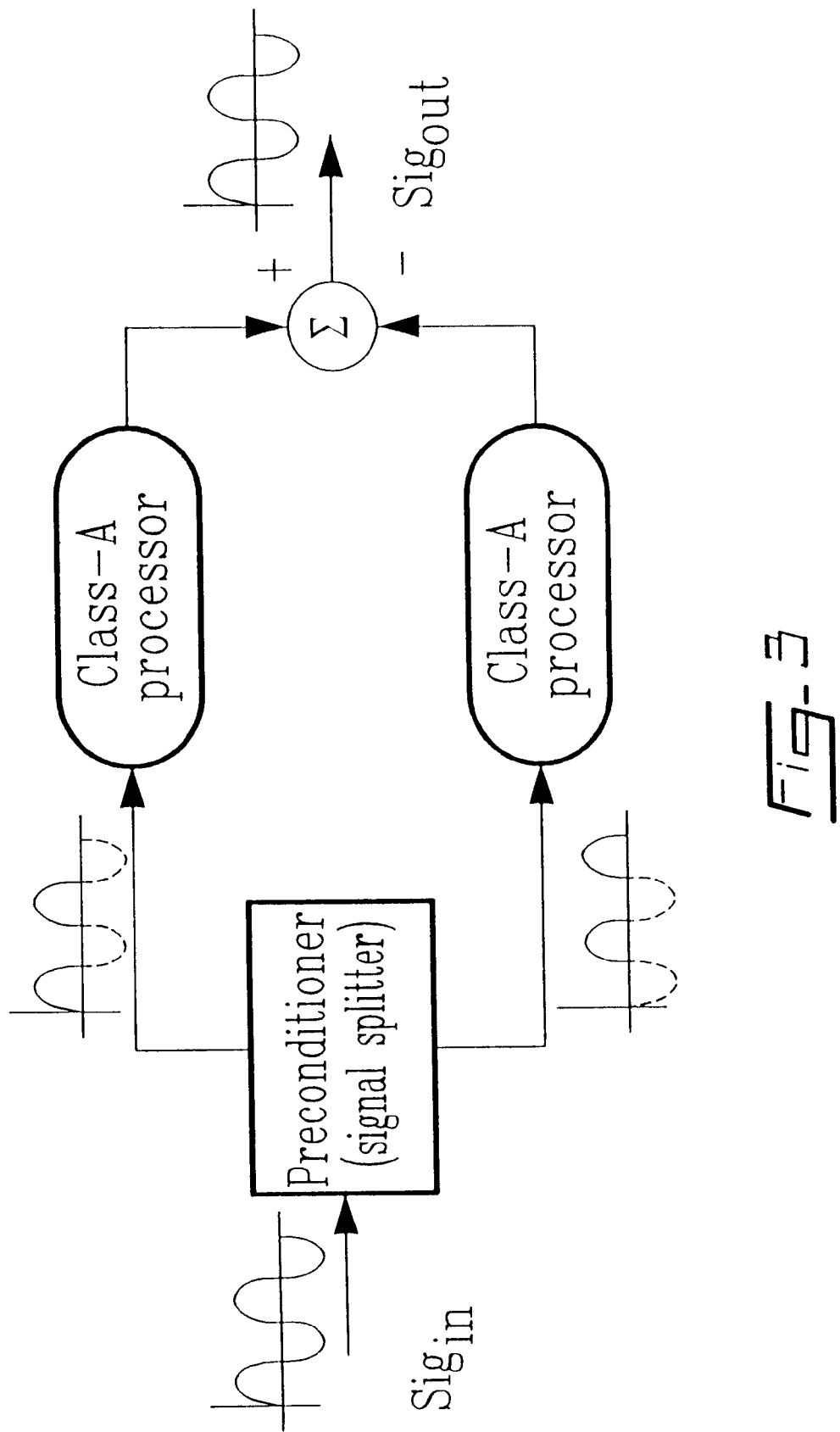
FIG. 3 illustrates the implementation of a class-AB signal processor using two identical class-A processors.

The bipolar filter of the preferred embodiment of the present invention compares to the BiCMOS realization in M. Punzenberger and C. C. Enz, "A 1.2 V BiCMOS class AB log-domain filter," ISSCC Dig. Tech. Papers, pp. 56–57, Feb. 1997 as follows:

(i) The maximum −3 dB cutoff frequency is extended from about 1 MHz, for a 1.2 V supply, to 30–100 MHz, (ii) The input preconditioning circuitry, which is crucial for the success of a filly integrated filter and for testing VHF circuits, is incorporated on chip, unlike the off-chip discrete-components preconditioner used by M. Punzenberger and C. Enz.

(iii) Each individual integrator is differential, in the sense that it would not respond to a common-mode signal applied to its positive and negative ports simultaneously (refer to equations (8) and (9) below). That was not the case for the integrator in M. Punzenberger et al.

(iv) The integrator, and all the input and output interface circuitry, do not employ P-type devices in the signal path, This extends their applicability to the many bipolar processes which feature low-quality low-bandwidth PNP transistors, and does not restrict them to BiCMOS processes or to the special bipolar processes featuring high-quality PNP transistors.

(v) Finally, unlike in M. Punzenberger et al., the filters gain in this implementation is programmable. This, in addition to the wide frequency tuning range, can be a highly desirable feature in many applications (e.g. See V. Gopinathan, M. Tarsia, and D. Choi, "A 2.5 V, 30 MHz-100 MHz, 7th-order, equiripple group-delay continuous-time filter and variable-gain amplifier implemented in 0.25 $\mu$m CMQS," ISSCC Dig. Tech. Papers, pp. 394–395, February 1999.).

Principle of Log-Domain Filtering

The principle of log-domain filtering can be summarized as shown in FIG. 1(b) (See also R. W. Adams, "Filtering in the log domain," presented at the 63rd AES Audio Engineering Soc. Conf., New York, May 1979.). The input signal vN, in voltage format, is first converted to a current signal $l_{IN}$ by a voltage-to-current converter (V/I). In its simplest implementation, this VII can be a linear resistor R, resulting in an input linear current signal $l_{IN}=v_{IN}/R$, This current signal is then logarithmically compressed using a LOG pre-processor. This can be practically achieved by pushing tN into the collector of a bipolar transistor with a grounded emitter terminal. The compressed signal will appear at the base of the transistor in voltage format, and will be given by (the notation "comp()" is used throughout the text to denote nonlinear (log-domain) compressed voltage signals, in the drawings, the notation "^" is used):

(1) $comp(v_{IN})=V_T \ln (l_{IN}/I_S)=V_T \ln ((v_{IN}/R)/I_S)$ where $V_T$ denotes the thermal voltage, and $I_S$ is the bipolar saturation current. This signal is then applied to a nonlinear signal processor block denoted by the "LOG filter". The characteristics of this "LOG filter" are discussed below, It is assumed at this point that the "LOG filter" can be designed such that the output nonlinear signal $comp(v_{OUT})$ will be some form of a filtered version of $comp(v_{IN})$ and that, when $comp(v_{OUT})$ is logarithmically uncompressed, it will result in a perfectly linear signal tOUT This uncompression is performed by the ANTI-LOG post-processor Practically, it can be achieved by applying $comp(v_{OUT})$ to the base of a bipolar transistor with a grounded emitter terminal. The current $l_{OUT}$ will be the collector current of the bipolar transistor, and is given by (2) $l_{OUT}=I_S \exp(comp(v_{OUT})/V_T)$ In many cases, it will be necessary to convert the output current $l_{OUT}$ to a voltage signal, for example, for measurement purposes, using a current-to-voltage converter (I/V). The latter can be a linear resistor R, resulting in an output voltage signal $v_{OUT}=R\,I_s \exp(comp(v_{OUT})/V_T)$. In order to maintain an overall linear input($l_{IN}$)-output($l_{OUT}$) transfer function, the large-signal behavior of the LOG filter needs to satisfy very specific requirements.

For simplicity, a first-order LOG filter example is considered. As for conventional filters, it would consist of one integrator block. This integrator, known as a "log-domain integrator", has positive and negative inputs ($comp(v_{POS})$, $comp(v_{NEG})$), and a single-ended output ($comp(v_o)$) connected to an integrating capacitor C. In order to ensure an overall linear input-output filter transfer function, the large-signal behavior of such an integrator should satisfy an equation, relating its input and output voltages to the current ($C(d\,comp(v_o)/dt)$) flowing in the integrating capacitor, of the following format:

(3) $C(d\,comp(v_o)/dt)=I_o \cdot \exp((comp(v_{pos})-comp(v_o))/V_T)-I_o \cdot \exp((comp(v_{NEG})-comp(v_o))/V_T)$.

As in conventional filters, in order to implement a first-order system, the output voltage is fed back to the negative input terminal ($comp(v_{NEG})=comp(v_o)$), resulting in a damped integrator. Equation (3) will therefore be reduced to (4) $C(d\,comp(v_o)/dt)=I_o \cdot \exp((comp(v_{POS})-comp(v_o))/V_T)-I_o$.

A simple circuit that realizes a transfer function of the same format as (4) is the "diode-capacitor-current source" shown in FIG. 1(b). Setting (comp($v_{POS}$)=comp($V_{IN}$)) and (comp ($v_o$)=comp($v_{OUT}$)), the current flowing into the capacitor of FIG. 1(b) is given by (5) C(d comp($v_{OUT}$)/dt)=$I_s$·exp ((comp($v_{IN}$)—comp($v_{OUT}$))/$V_T$)—$I_o$.

Multiplying through by exp (comp($v_{OUT}$)/$V_T$) using the chain rule, and rearranging, equation (5) can be written as (6) exp (comp($v_{IN}$)/$V_T$)=($V_T$/$I_S$) (C(d exp(comp($v_{OUT}$)/$V_T$)/dt)+($I_o$/$I_S$) exp (comp($v_{OUT}$)/$V_T$)

From (1) and (2), are obtained (exp(comp($v_{IN}$)/$V_T$)=$1_{IN}$/$I_S$) and (exp (comp($v_{OUT}$)/$V_T$)=$1_{OUT}$/$I_S$). Substituting in (6) results in (7) $1_{IN}$=($V_T$/$I_S$)C d$1_{OUT}$/dt+($I_o$/$I_S$) $1_{OUT}$ which describes a linear input-output first-order filter with a tunable cutoff frequency proportional to $I_o$.

Higher order filters can be synthesized using a state-space based approach (See D. R. Frey, "Log-domain filtering: an approach to current-mode filtering," in Proc. Inst. Elect. Eng., vol. 140, no. 6, pp. 406–416, December 1993.), or the less component-sensitive LC-ladder based approach (See D. Perry and G. W. Roberts, "Log-domain filters based on LC ladder synthesis," in Proc. 1995 IEEE Int. Symp. Circuits and Systems, pp. 311–314, May 1995.), as long as the transfer function of the log-domain integrator used has a general format similar to equation (3). This is the case for the new class AB 1.2 V integrator of the preferred embodiment of the present invention.

The Differential Class-AB Integrator

The integrator of the preferred embodiment is shown in FIG. 2. Voltages comp($V_{INP}$) and comp($V_{INN}$) are the positive and negative input voltages respectively. The voltages across the two capacitors, comp($v_{OUTP}$) and comp($v_{OUTN}$), are the output voltages.

Writing a loop equation around L1, the current in $Q_2$ is given by $1_{Q2}$=$I_o$ exp((comp($v_{INP}$)—comp($v_{OUTP}$))/$V_T$). Transistors $Q_3$ and $Q_4$ are biased at a constant current $I_o$. Any large ac signal appearing at node comp($V_{OUTP}$) will be copied to the base of $Q_3$ then duplicated at node P1 by $Q_4$, as comp($v_{P1}$)=comp($v_{OUTP}$). Therefore, transistors $Q_3$-$Q_4$ form a low-voltage buffer.

Since $Q_{10}$ is also biased at a constant current $I_o$, the ac voltage at its base, and at the base of $Q_6$, will follow comp($v_{INN}$). The ac base-emitter voltage of $Q_6$ is therefore given by comp($v_{TNN}$)—comp($v_{P1}$)=comp($v_{INN}$—comp ($v_{OUTP}$), resulting in a total current $1_{Q6}$=$I_o$ exp((comp ($v_{TNN}$)—comp($v_{OUTP}$))/$V_T$) flowing in $Q_6$. This current $1_{Q6}$ then flows in $Q_{12}$, and subsequently in $Q_{11}$.

The current (C(d comp($v_{OUTP}$)/dt)) flowing in capacitor $C_{pos}$ represents the difference between two currents: $1_{Q2}$-$1_{Q11}$=$1_{Q2}$-$1_{Q6}$. Using the expressions derived earlier for $1_{Q2}$ and $1_{Q6}$ in terms of the input and output voltages, the current in $C_{pos}$, is given by $$C(d\ comp(v_{OUTP})/dt) = \iota_{Q2} - \iota_{Q11} = \iota_{Q2} - \iota_{Q6} \quad (8)$$

$$= I_o \cdot \exp((comp(v_{INP}) - comp(v_{OUTP}))/V_T) -$$

$$I_o \cdot \exp((comp(v_{INN}) - comp(v_{OUTP}))/V_T).$$

A similar expression can be obtained for the current in $C_{neg}$ $$C(d\ comp(v_{OUTN})/dt) = \iota_{Q9} - \iota_{Q14} = \iota_{Q9} - \iota_{Q5} \quad (9)$$

$$= I_o \cdot \exp((comp(v_{INN}) - comp(v_{OUTN}))/V_T) -$$

$$I_o \cdot \exp((comp(v_{INP}) - comp(v_{OUTN}))/V_T).$$

Equations (8) and (9) have the same general format as equation (3), indicating that the circuit in FIG. 2 can indeed be used as a log-domain integrator.

Constant current sources ($I_o$/β) (not included in FIG. 2 for clarity because the introduction of such constant current sources will be apparent to one skilled in the art) were used to compensate for the finite betas (β) of the transistors, in order to increase the integrator gain and reduce distortion. Finally, note that the input and output voltages of the integrator are at the same dc level, making it possible to directly couple several integrators together to build a filter. The nominal supply voltage for the circuit is one base-emitter junction drop $V_{BB}$, plus the saturation voltages $V_{CEsat}$, of the positive and negative current sources, resulting in a minimum operating supply voltage of $V_{BE}$+2$V_{CEsat}$. The exact values of those voltages depend on the specific sizes and structures of the transistors used, as well as on their biasing levels.

Input and Output Interface Circuitry

Practically, input and output interface circuits are needed to use/test log-domain filters built using the integrator in FIG. 2. They need to operate with a 1.2 V power supply, and to meet stringent specifications in order not to mask the characteristics of the filter. They need to (i) be compatible with the integrator's current signal levels and operating frequency, (ii) introduce lower distortion than the filter, and (iii) provide adequate and easy input and output impedance matching, often needed for high-frequency (digital) applications.

The Input Preprocessing Stage

Class-AB signal processors can handle current signals much larger than their quiescent bias current This significantly extends their dynamic range (DR) compared to class-A signal processors. One example of a class-AB circuit is the push-pull output stage of an amplifier, in which two complementary devices, namely an n-type and a p-type device, are used to handle the large positive and negative excursions of the signal, consecutively. Often, the performance of one of the complementary devices far exceeds the performance of the other, as is the case for many bipolar processes where the NPN transistors have much better characteristics compared to the PNP's. In this case, high-performance class-AB operation can still be achieved by using two identical all-NPN class-A signal processors. The concept is illustrated in FIG. 3. The positive swings of the input signal are applied to one of the two circuits, while the negative swings are rectified and processed by the other circuit. The original signal is then recovered at the output by subtraction.

Figure 4:
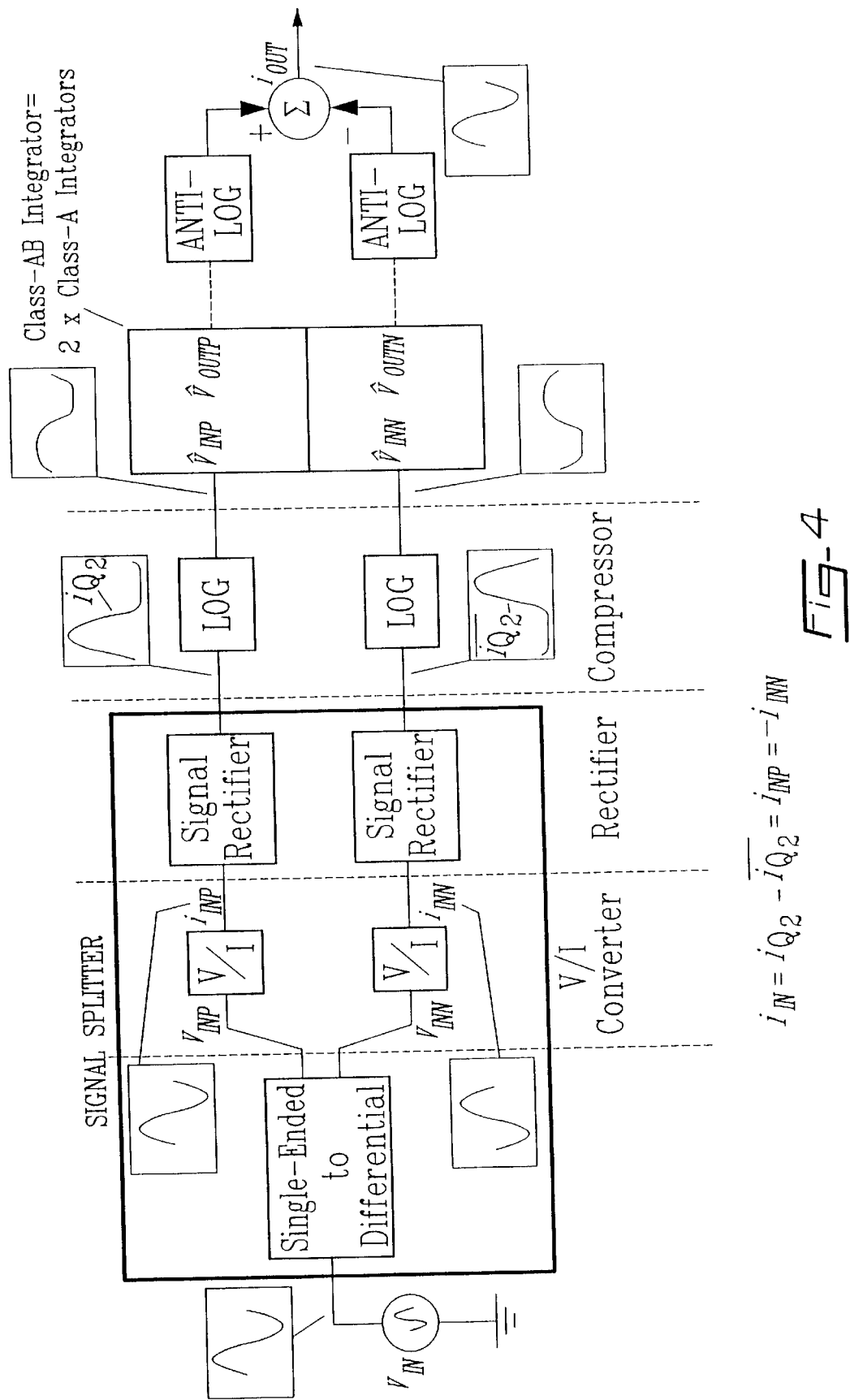
FIG. 4 illustrates a schematic block diagram of the main building blocks of the pre-processor used in a preferred embodiment, to ensure class-AB operation.

The integrator circuit of FIG. 2 employs only NPN transistors, and can only handle large positive current excursions The circuit can be viewed as being composed of two identical class-A sub-circuits described by equations (8) and (9). Class-AB operation can be achieved using the approach discussed earlier. It is necessary to ensure that the compressed input voltages comp($v_{INP}$) and comp($v_{INN}$) remain strictly positive. FIG. 4 shows the different pre-processing blocks used to ensure this condition, for the implementation presented herein. Two differential input signals, $v_{INP}$ and $v_{INN}$, are generated from the single-ended input $v_{IN}$ using an off-chip processor. The voltage signals are then transformed into current signals, $1_{NP}$ and $1_{TNN}$, using an on-chip V/I converter. Two rectifier circuits are then used to generate the complementary strictly positive current signals, denoted $1_{Q2}$ and NOT($1_{Q2}$), wherein "NOT()" represents, throughout the text, the complementary and strictly positive signal. In the drawings, the notation "" is used. These two signals are then compressed using LOG processors, and subsequently, each one of them is applied to one of the inputs of the class-AB integrator. At the output of the filter, ANTI-LOQ blocks are used to uncompress the output voltages, and the original signal is reconstructed by subtraction.

An important practical issue that needs to be addressed is the implementation of the signal rectifiers. If simple diode-type rectifier circuits are used, the resulting signals would contain sharp transitions/edges, which would introduce considerable distortion at the output, especially for high-frequency applications. A common "softer" approach for rectification consists of using a circuit that keeps constant the product of the two input signals. This is similar to the situation of the class-AB push-pull output stage.

What follows is a discussion in details of the actual circuit implementation and the operation of the three pre-processing stages of FIG. 4.

Figure 5:
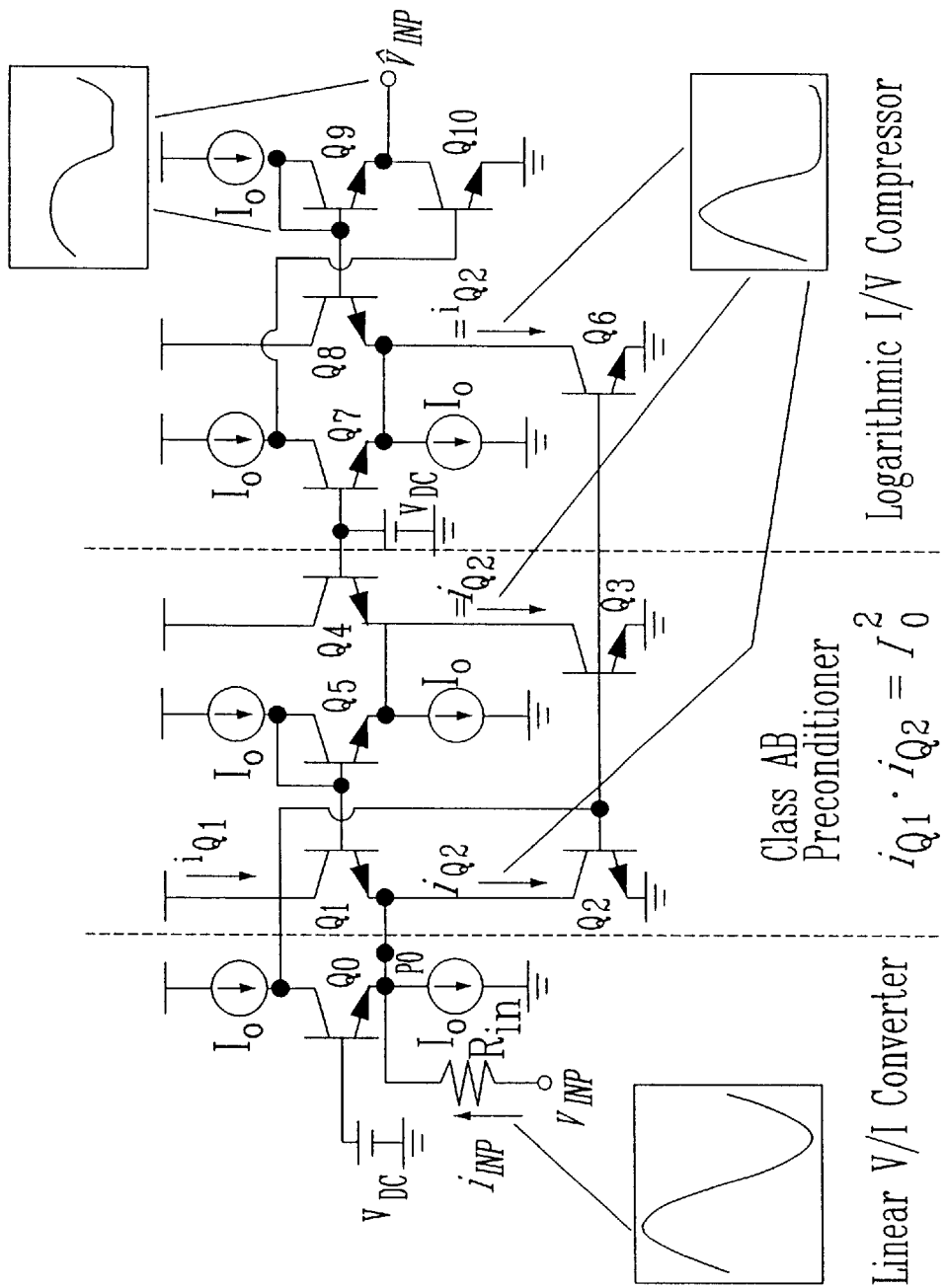
FIG. 5 illustrates one half of the input stage (the voltage and current waveforms shown were obtained from HSPICE simulations using real device models with $3I_{INPpeak}=10\ I_o$).

FIG. 5 shows the transistor level circuitry of the positive half of the input stage. Transistor $Q_0$ is biased at a constant current and has a fixed base voltage; this, along with the feedback loop to its collector, makes node P0 behave as an ac virtual ground. The V/I conversion is simply performed by a resistor $R_{in}$ connected to P0. This V/I converter is the bipolar version of the CMOS I/I converter discussed in W. Sansen, M. Steyaert, V. Peluso, and E. Peeters, "Toward sub 1V analog integrated circuits in submicron standard CMOS technologies," ISSCC Dig. Tech. Papers, pp. 186–187, February 1998.

The input current is then processed by the feedback loop composed of $Q_1$-$Q_5$ as follows: The current $1_{Q2}$ is copied to $Q_3$ and flows in $Q_4$ to create a voltage $v_{E4}$ at its emitter given by

(10) $v_{E4}=V_{DC}-V_T\ln(1_{Q2}/I_S)$

This voltage is then level-shifted by $Q_5$, to appear at the base of $Q_1$ as

(11) $v_{B1}=V_{DC}-V_T\ln(I_{Q2}/I_S)+V_T\ln(I_o/I_S)$ while the voltage $v_{B1}$ at the emitter of $Q_1$ is kept constant by $Q_0$, and the feedback loop around it, such that

(12) $v_{E1}=V_{DC}-V_T\ln(I_o/I_S)$

Using (10)-(12) it can be shown that

(13) $1_{Q1}\cdot1_{Q2}=I_o^2$

The relation between $1_{Q2}$ and the actual input signal $1_{INF}$ can be obtained by writing a nodal equation at P0

(14) $1_{Q2}=1_{Q1}+1_{INP}$

Substituting in (13) and solving, results in $$i_{Q2} = (i_{INP}/2) + \sqrt{((i_{INP}^2/4) + I_o^2)} \quad (15)$$

Equation (15) fully describes the waveform of $1_{Q2}$ shown in FIG. 5:

(1) For $1_{INP}=0$, the current in $Q_2$ equals the quiescent value $1_{Q2}=I_o$.

(2) When $1_{INP}$ is in its positive swing with $(1_{INP}^2/4)>>I_o^2$, the current in $Q_2$ follows $1_{INP}$: $1_{Q2}\approx1_{INP}$.

(3) When $1_{INP}$ is in its negative swing with $(1_{INP}^2/4)>>I_o^2$, the current in $Q_2$ approaches zero: $1_{Q2}\geq0$ and $I_{Q2}\approx0$.

As desired and shown from the waveform in FIG. 5, the circuit composed of $Q_1$-$Q_5$ does rectify the input signal without introducing sharp transitions, even for very large signals.

Simultaneously, the second half of the input stage processes $1_{TNN}$ resulting in $$NOT(i_{Q2}) = (i_{INN}/2) + \sqrt{((i_{INN}^2/4) + I_o^2)} \quad (16)$$

To conclude, the operation of the input splitter used (see FIG. 4 and FIG. 5) and the relation between the different signals generated prior to the input terminals of the filter can be summarized as follows:

(1) From (15) and (16), the product of the two complementary input signals to the filter, $1_{Q2}$ and NOT($1_{Q2}$), can be shown to be a constant: $1_{Q2}\cdot\text{NOT}(1_{Q2})=I_o^2$ (2) These two input signals, $1_{Q2}$ and NOT($1_{Q2}$), are related to what is denoted as being the input current $1_{IN}$, as follows: $1_{IN}=1_{Q2}-\text{NOT}(1_{Q2})=1_{INP}=-1_{INN}$.

(3) The signal $1_{TN}$ is simply a scaled version of the single-ended input voltage $v_{IN}$.

Finally, the remaining circuitry of FIG. 5 compresses $1_{Q2}$ before it is applied to the positive input of the filter comp ($v_{INP}$). As shown in FIG. 5, current $t_{Q2}$ flows in transistor $Q_8$. With its emitter set to virtual ground by $Q_7$ and the feedback loop to its collector, transistor $Q_8$ performs the input I/V logarithmic compression with the compressed voltage appearing at its base. This voltage is then level shifted using $Q_9$ and applied as input to the filter.

The Output Post-Processing Stage

Figure 6:
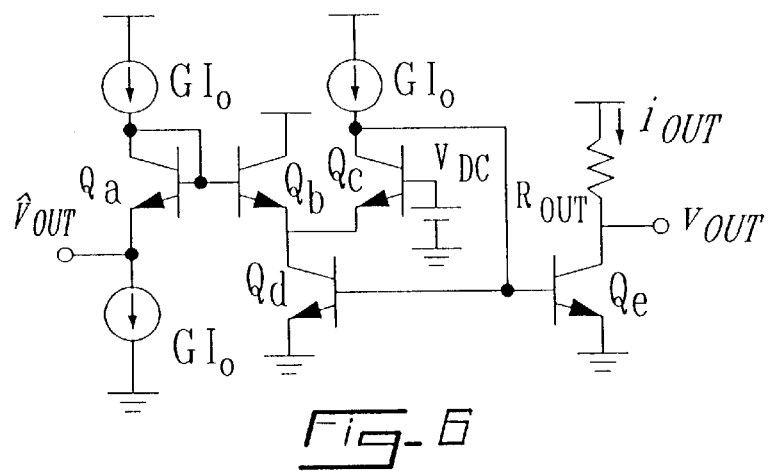
FIG. 6 illustrates one half of the output stage (G is the gain factor).

The uncompressing (ANTI-LOG) V/I output stage, and the linear IN conversion necessary for measuring purposes, are implemented as shown in FIG. 6. The compressed output voltage comp($v_{OUT}$) is applied to the emitter of $Q_3$. This transistor is biased at a constant current $GI_o$ (where G is a gain factor); it level shifts comp($v_{OUT}$) towards the positive power supply and applies it to the base of $Q_b$. This level-shifting stage is necessary in order to properly bias $Q_b$ within the allowable voltage headroom. The emitter of transistor $Q_b$ is set to a virtual ground potential by $Q_c$, and the feedback loop to its collector; $Q_b$ acts as the uncompressing V/I output stage. The current in $Q_b$ corresponds to $1_{OUT}$ in FIG. 1(b). Instead of performing the final I/V conversion using a resistor connected to the collector of $Q_b$, $1_{OUT}$ is first mirrored through $Q_d$ and $Q_e$ and converted to voltage through $R_{out}$. This was done to maximize the allowable output voltage swing.

It can be shown that (refer to equation (17) below) the overall dc gain of the filter can be controlled by varying the gain factor G of the current sources biasing the output stage (FIG. 6). Finally, note that, for high-frequency applications, input and output impedance matching can easily be achieved by setting resistors $R_{in}$ and $R_{out}$ of FIG. 5 and FIG. 6 to the desired values (e.g. 50 Ω).

TABLE 1

Specifications of the Prototype Filter

| | |
|---|---|
| Order | Third-order |
| Type | Chebyshev |
| Passband ripple | 1.0–1.2 dB |
| Cutoff frequency | Tunable |
| Gain | Programmable up to 10 dB |
| Input preprocessing stage | Fully integrated |

Filter Specifications and Design

In order to verify the operation of the proposed circuitry, a prototype filter was designed with the specifications shown in Table 1.

$$\iota_{OUT}(s)/\iota_{IN}(s) = G^2/(s^3(C_1C_2C_3V_T^3/8I_o^3) + \quad (17)$$
$$s^2((C_1C_2V_T^2/4I_o^2) + (C_2C_3V_T^2/4I_o^2)) +$$
$$s((C_1V_T/1I_o) + (C_2V_T/2I_o) + (C_3V_T/2I_o)) + 2)$$

Figure 7A:
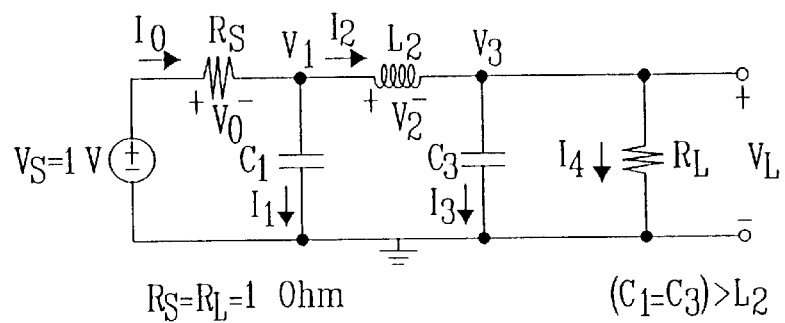
FIG. 7(a) illustrates a third-order Chebyshev low-pass LC-ladder prototype.
Figure 7B:
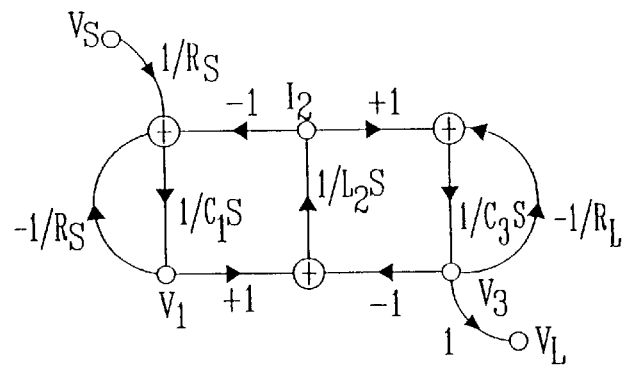
FIG. 7(b) illustrates the corresponding signal-flow graph of the third-order Chebyshev low-pass LOC-ladder prototype of FIG. 7(a).
Figure 8:
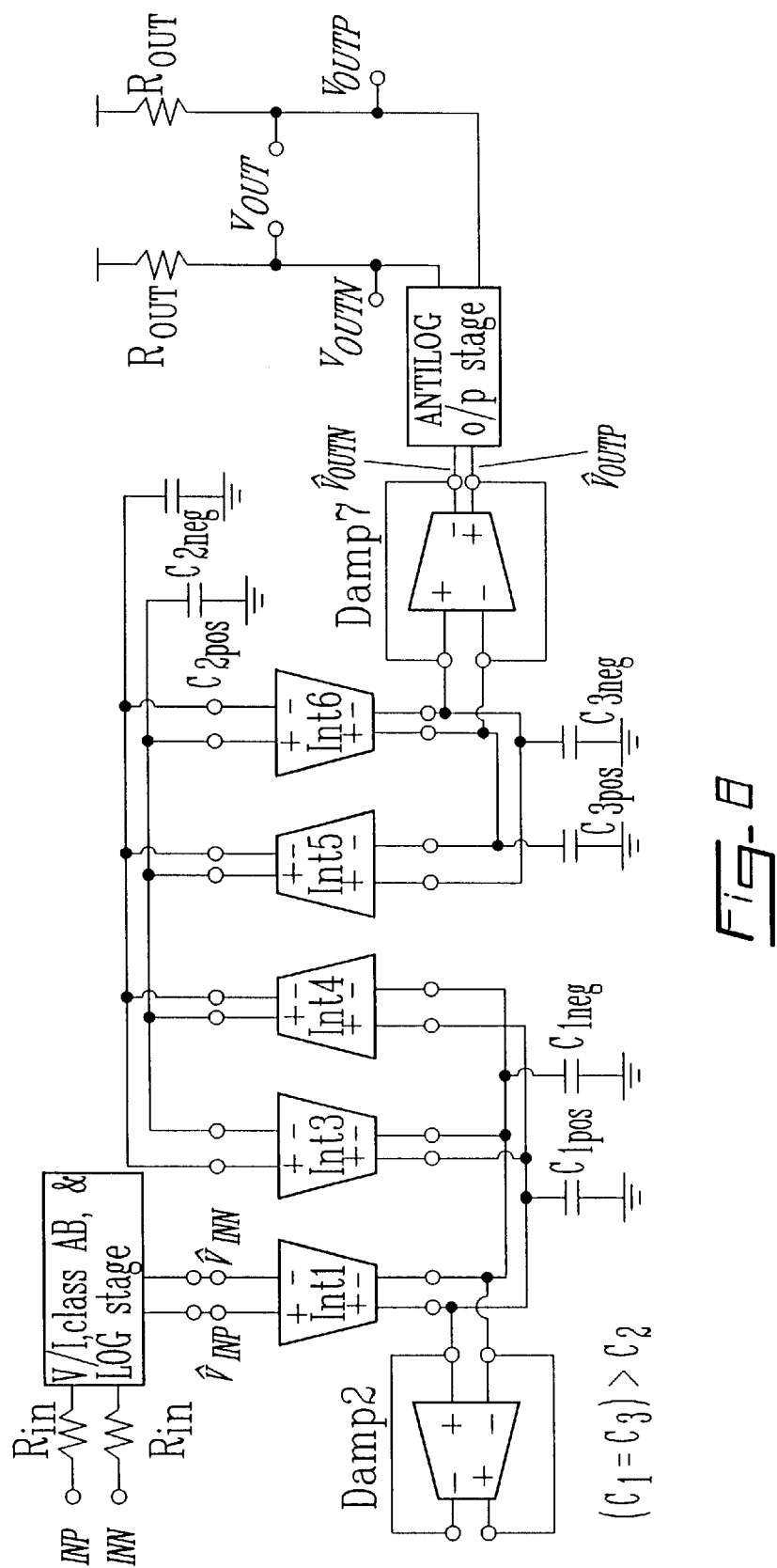
FIG. 8 illustrates a log-domain third-order Chebyshev filter realization.

The filter was synthesized using the LC-ladder based approach, known for its low-sensitivity to component variations. The doubly-terminated LC-ladder prototype of the filter and the corresponding signal-flow-graph are shown in FIG. 7. Direct mapping from the linear SFG to a log-domain realization was performed, resulting in the log-domain implementation shown in FIG. 8. It is often questioned whether a specific circuit realization of a log-domain filter is actually input-output linear, whether it is class AB or differential, etc. In order to ensure proper operation, a complete large-signal analysis of the entire filter circuit including the input and output stages was performed, which led to equation (17) relating the output current $1_{OUT}$ to the input current $1_{IN}$ Equation (17) shows that the circuit is indeed linear, an that it implements a third-order filter with a cutoff frequency tuned using $I_o$ and a gain controlled by the dc bias current of the output stage ($GI_o$). Note that due to the underlying LC-ladder prototype, the nominal dc gain of the filter is 0.5 (−6 dB) when G=1.

Measurement Results

Figure 9:
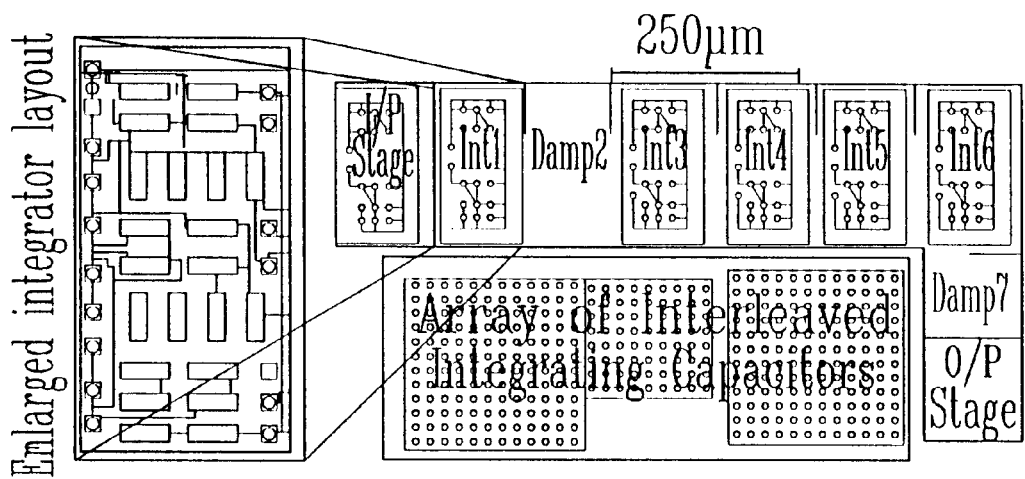
FIG. 9 illustrates a photomicrograph of the 30-MHz filter.
Figure 10:
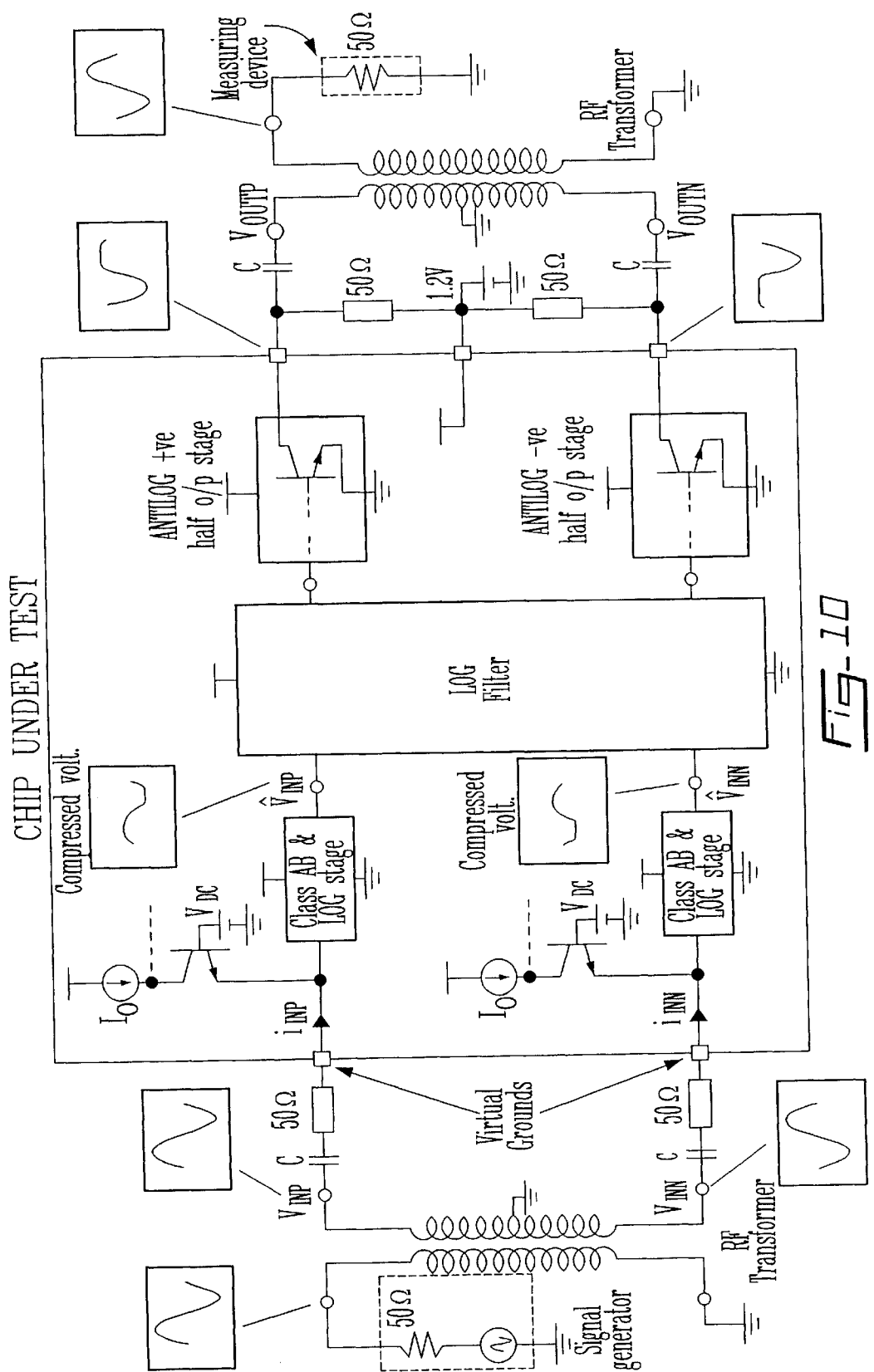
FIG. 10 illustrates the complete schematic of the test setup of the preferred embodiment.
Figure 11:
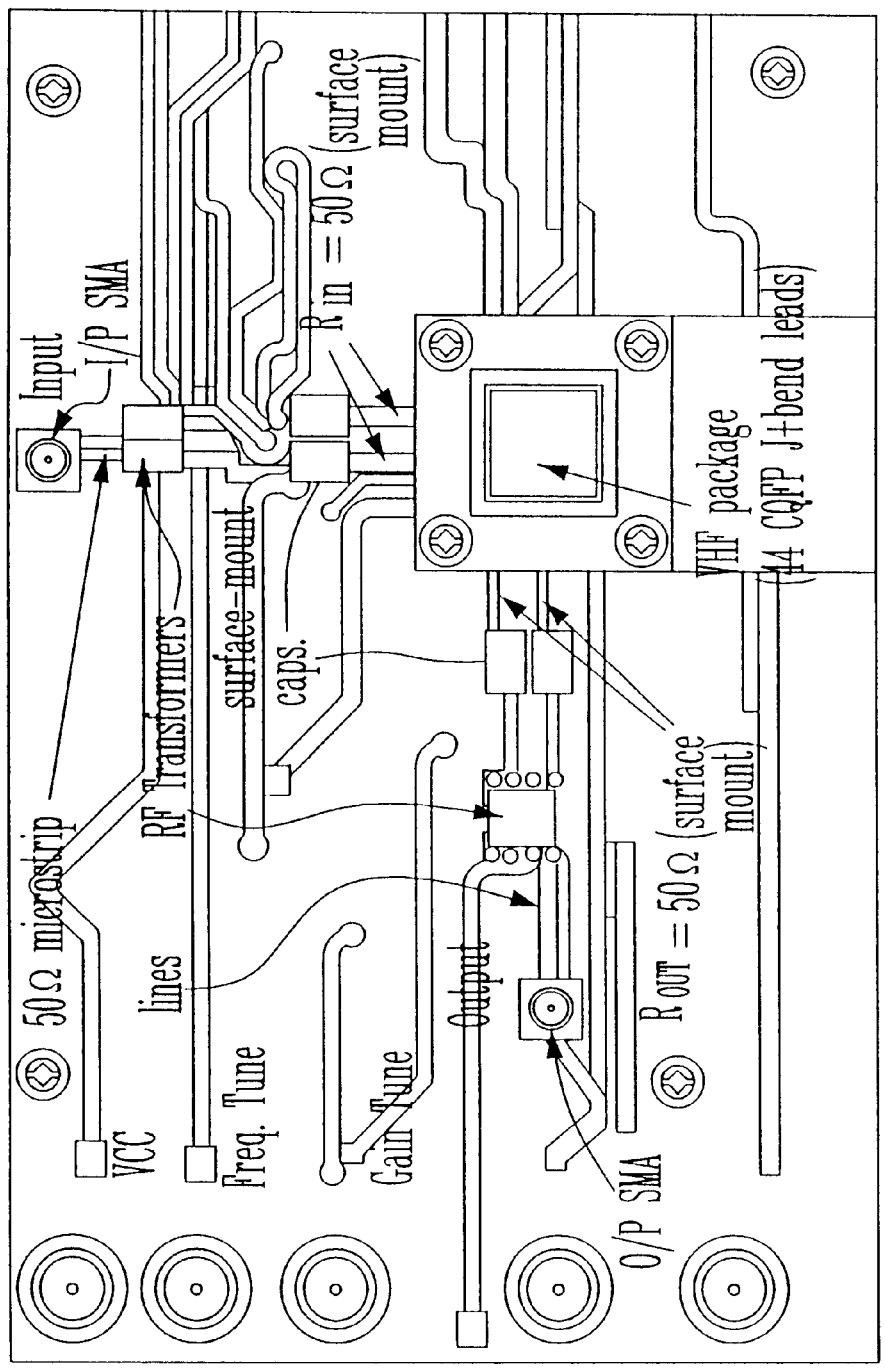
FIG. 11 is a picture of the printed-circuit board used to test the 100-MHz filter. Surface-mount capacitors were used on the opposite side of the board for dc supply noise filtering.

The component and bias current values used for a specific implementation are often the result of conflicting design considerations including power, capacitor and transistor sizes, DR, SNR, frequency predictability, etc. Two variations of the circuit in FIG. 8 were experimented with, both were integrated in a 0.5 μm emitter width, 25 GHz bipolar process provided by Nortel Semiconductors. The first filter employs 10–22 pF capacitors resulting in 1.2 dB passband ripples and a maximum cutoff frequency of 30 MHz, while the second filter employs 2.5–5 pF capacitors resulting in 1.0 dB passband ripples and achieves a maximum operating frequency of 100 MHz for the same bias current. A photomicrograph of the latter is shown in FIG. 9. Note that in the actual implementation, the circuitry for the damped integrators connected to the input and output nodes were reduced by replacing portions of the original integrator by simple current sources. A detailed schematic of the test setup is depicted in FIG. 10. The single-ended input signal from the signal generator is converted to a differential signal using an RF transformer. Large off-chip capacitors C are used to dc-decouple the input differential voltage signals. This was done to simplify the test setup. Another alternative to avoid using coupling capacitors would have been to add a do offset, equivalent in magnitude to the do level at the input nodes of the chip, to the secondary port of the input transformer (currently grounded in FIG. 10). This, however, can result in undesirable offsets added to $1_{INP}$ and $1_{INN}$. Finally, it is worth noticing that the sizes of the input and output voltages can, in principle, be made as large as needed by properly scaling $R_{in}$ (FIG. 5) and $R_{out}$ (FIG. 6). For the test setup, those resistors were set to 50 Ω for impedance matching. Finally, the two complementary output voltages are subtracted using a second RF transformer at the output, in order to reconstruct the output signal. A photograph of the measurement setup is shown in FIG. 11. The filter was housed in a standard 44-pin quad flatpack (CQFP) J-bend leads package suitable for VHF applications. All external circuitry was surface-mount-type to minimize parasitics, and 50 Ω microstrip lines and SMA connectors were used at input and output for matching.

Figure 12:
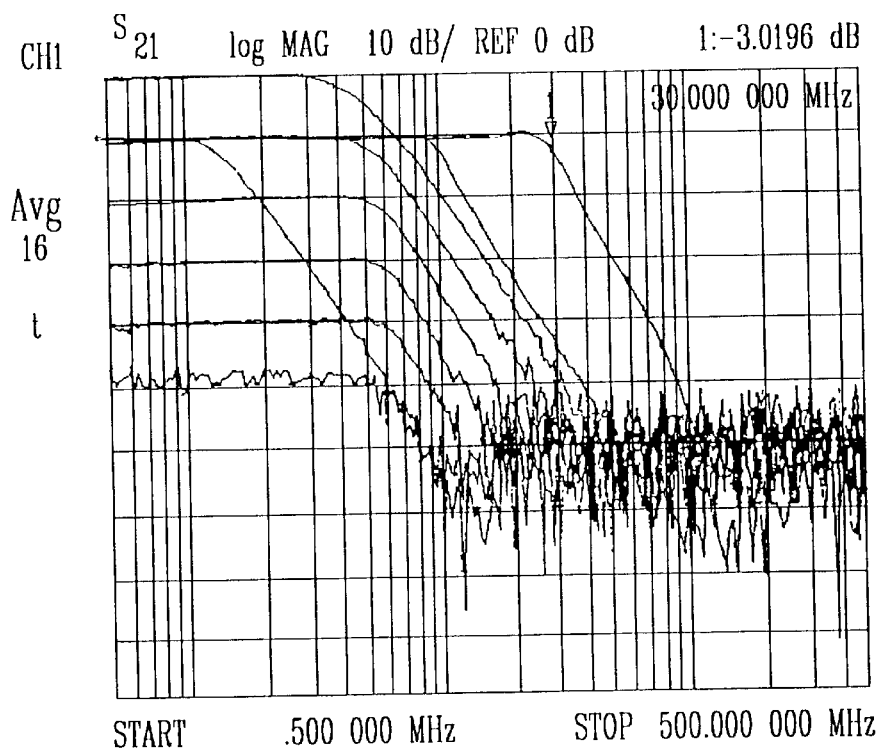
FIG. 12 illustrates the frequency and gain tunability of the 30-MHz filter. Notice the wide range of gain control.
Figure 13:
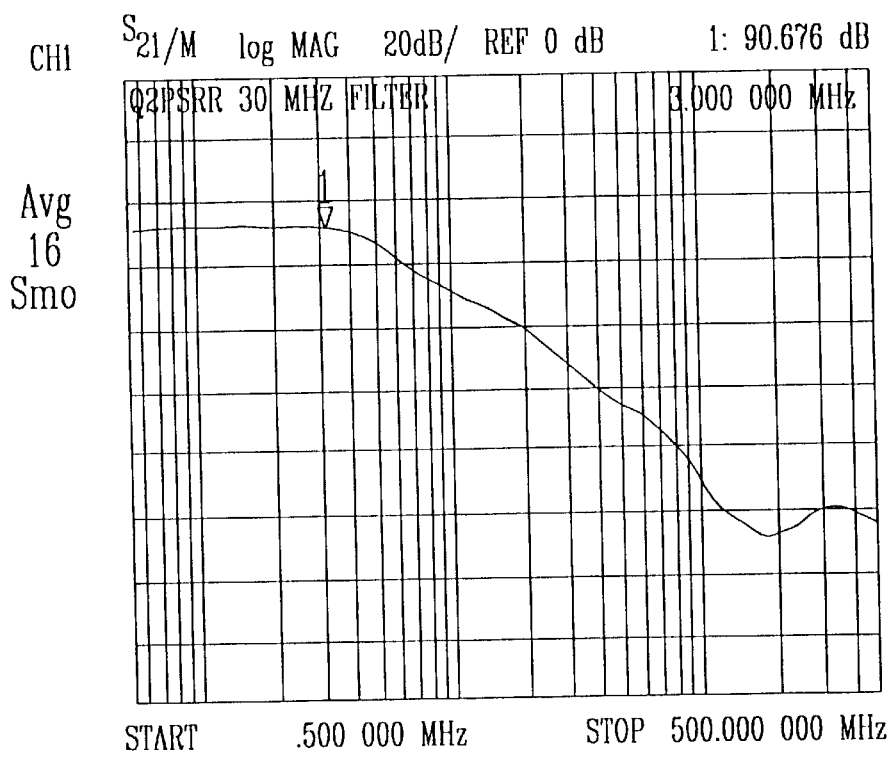
FIG. 13 illustrates the measured power supply rejection ratio for the 30-MHz filter.
Figure 14A:
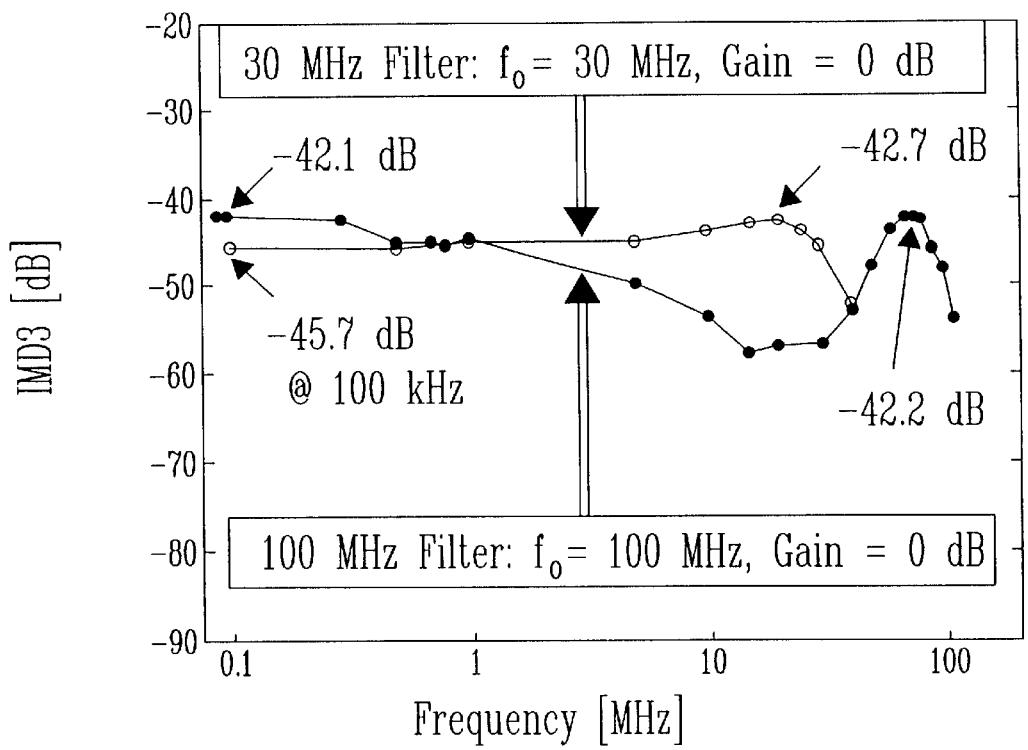
FIG. 14(a) and FIG. 14(b) illustrate the intermodulation distorsion versus frequency for the two filters under a variety of testing conditions.
Figure 14B:
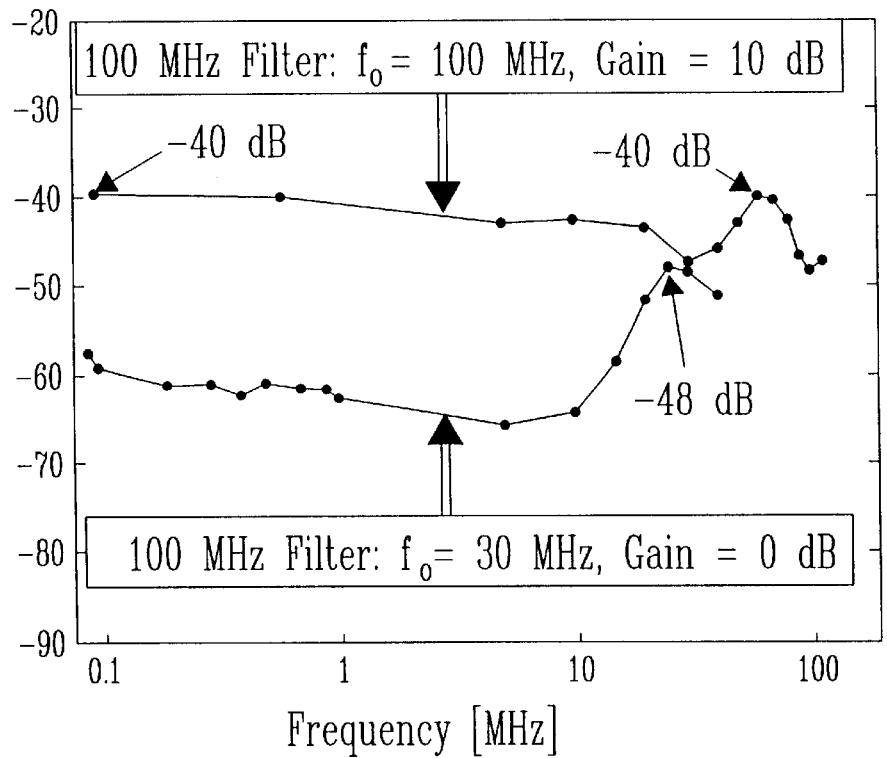

The frequency response of the 30 MHz filter is shown in FIG. 12. While setting the gain to 0 dB, the 3 dB cutoff frequency is tunable from 1.5 MHz up to 30 MHz. Note also the wide tuning range of the gain from −40 dB to +10 dB. A plot of the ratio of the filter's gain when a signal is applied to its input terminal, to the filter's gain when a signal is superimposed onto its power supply is shown in FIG. 13. It is a measure of the filters Power Supply Rejection Ratio (PSRR) versus frequency. Up to one-tenth of the cutoff frequency (i.e. up to 3 MHz), the PSRR is ≈ 90 dB; it decreases to about 46 dB at the cutoff frequency of 30 MHz. The distortions of the two filters were measured using one- and two-tone tests. For the two-tone test, two signals of equal amplitude, spaced by a small frequency difference (a 100 kHz spacing for signals in the MHz range, and a 10 kHz spacing for signals in the kHz range) were generated then mixed using a wideband resistive power combiner. In order to ensure class AB excitation, the sum of the magnitudes of the two current signals was set to be five times the value of the filter's quiescent bias current. A plot of the third-order intermodulation distortion of both filters, for different testing conditions, are shown in FIG. 14. In FIG. 14(a), the two filters were set to their maximum cutoff frequencies, with gains of 0 dB. As expected, the distortion increases near the edge of the cutoff frequencies. Two test conditions, different from those in FIG. 14(a), are of interest. First, how does the distortion vary with an increase in the filter's gain ? Second, how does it vary for different biasing conditions? The answers are shown in FIG. 14(b) for the 100 MHz filter. The upper curve shows the intermodulation distortion of the filter with its gain set to the maximum value of 10 dB. It is noticed that the midband distortion deteriorates considerably, it goes from about −58 dB to −43 dB at 15 MHz, while the worst case distortion only deteriorates by about 2 dB from −42.1 dB to −40 dB at 100 kHz.

The effect of biasing on the filters distortion was tested by setting the bias current to its minimum, resulting in a cutoff frequency of 30 MHz for the 100 MHz filter (the gain was 0 dB). As shown from FIG. 14(b), the midband lowest distortion decreases from −58 dB at 15 MHz to −65 dB at 5 MHz, while the worst case distortion decreases from −42 dB at 80 MHz to −48 dB at 25 MHz.

Figure 15:
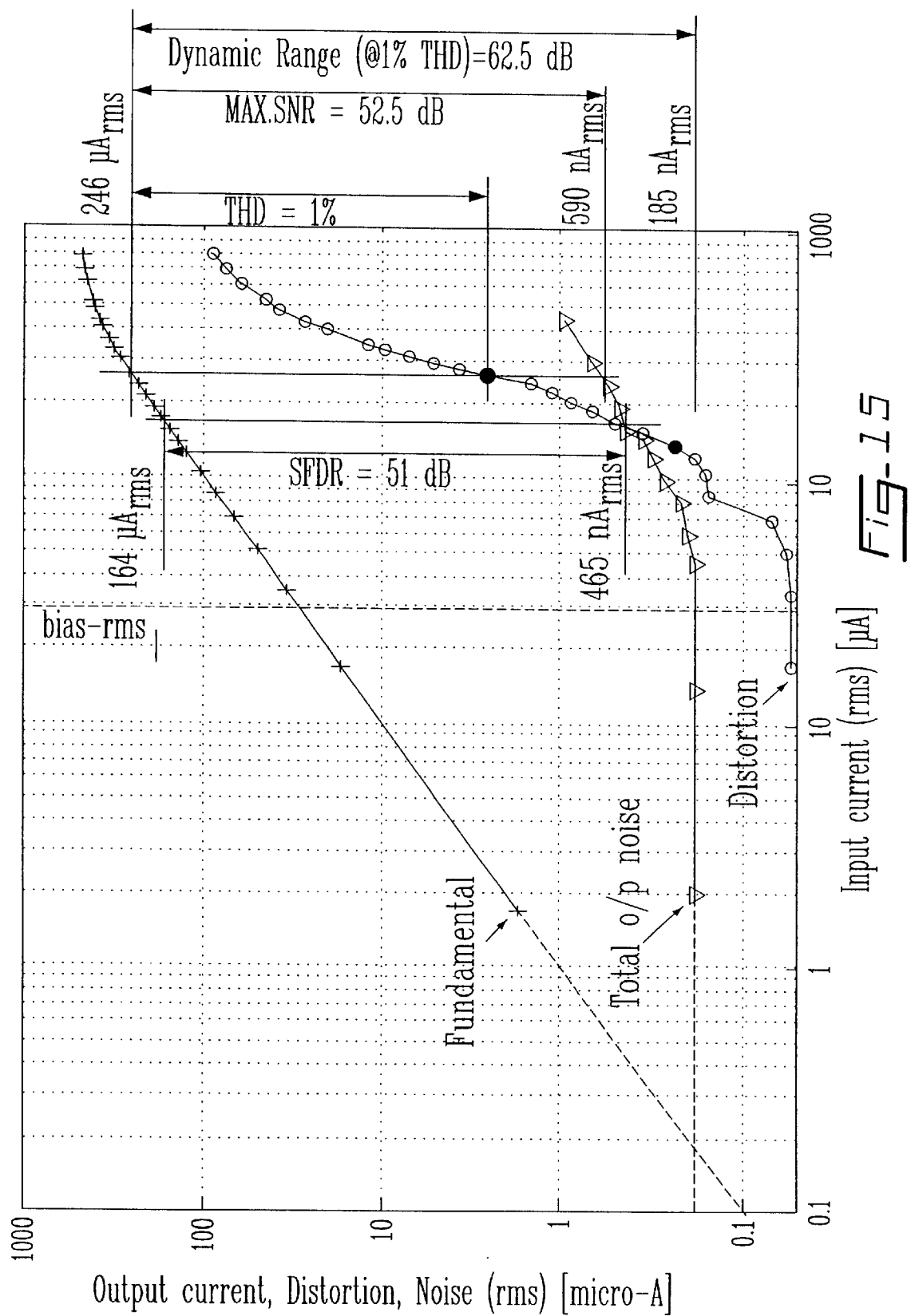
FIG. 15 illustrates the measured output signal, sum of distorsion components, and total output noise versus the input current (detailed measurements for the two points filled in black are given in FIG. 16(a) and (b).)
Figure 16A:
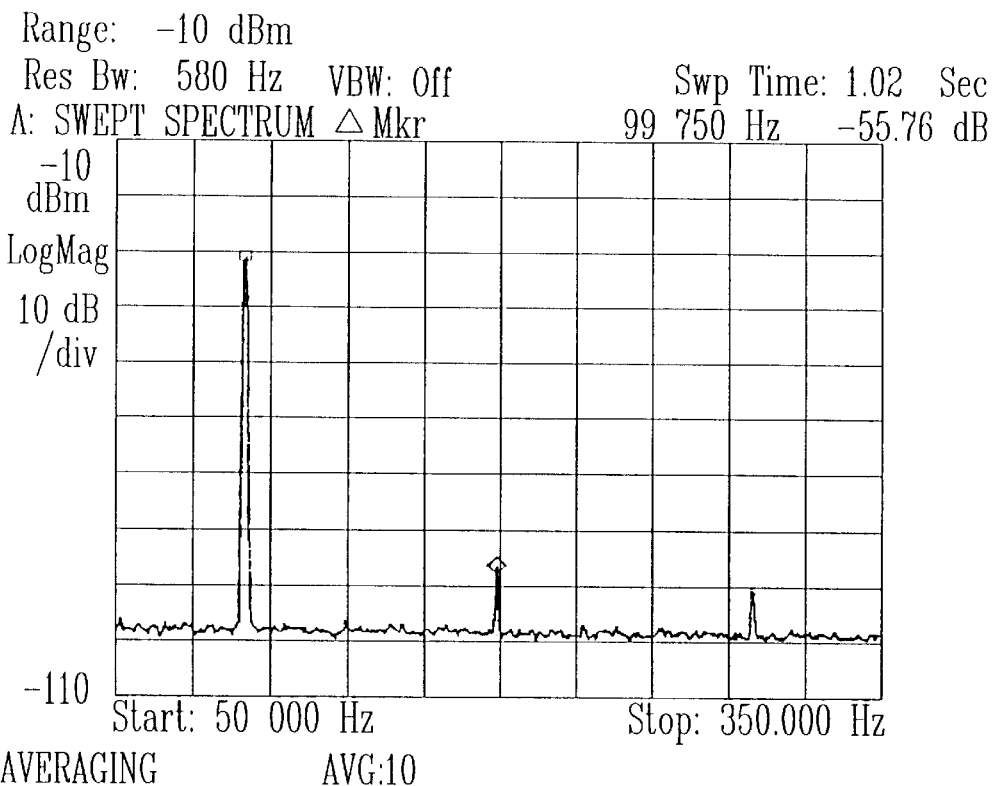
FIG. 16(a) and FIG. 16(b) illustrate distorsion measurements which correspond to the two data points filled in black in FIG. 15. The input current peak values were 195 $\mu$A (138 $\mu A_{rms}$) for the top graph, and 363 $\mu$A (257 $\mu A_{rms}$) for the bottom graph, setting the cutoff frequency of the 30-MHz filter to its maximum.
Figure 16B:
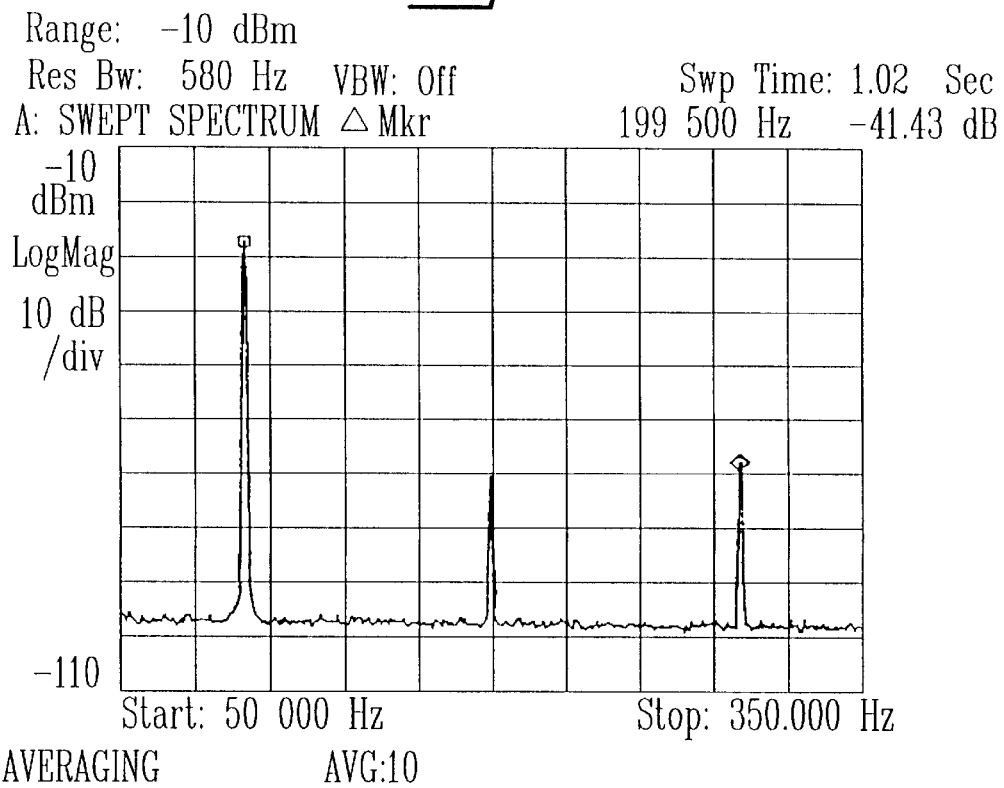

For a measure of the Total Harmonic Distortion (THD) using a single tone, it is important to select a test frequency that would not under-estimate the distortion introduced by the filter. To select an appropriate test frequency, the curves in FIG. 14(a) are used. In the case of the 100 MHz filter for example, the highest distortion occurs around 80 MHz. This frequency is not suitable for THD measurement due to its proximity to the cutoff frequency of the filter. A lower frequency in the MHz range, e.g. 30 MHz, would be more suitable. However, FIG. 14(a) suggests that at 30 MHz the distortion is very low and is not a fair measure of the filter's distortion. All the THD measurements were conducted at 100 kHz, where the distortion levels are closer to the worst case values for both filters, while being distant enough from their cutoff frequencies. A plot of the output distortion versus the magnitude of a single 100 kHz test tone for the 30 MHz filter, set to its maximum cutoff frequency ($I_o$=40 μA), is shown in FIG. 15 (detailed measurements for the two points filled in black on FIG. 15 are shown in FIG. 16). From the constructions on the figure, a 1% THD occurs for a maximum input peak current of 348 $\mu A_{peak}$ (246 $\mu A_{rms}$), corresponding to more than eight times the bias current. Superimposed on FIG. 15 is a plot of the total output noise versus the magnitude of the input signal. Typical of companding systems, noise was found to be signal dependent, resulting in a saturation of the SNR at large signal amplitudes. This characteristic has always raised the comment that log-domain filtering will not succeed because large signals will cause large noise and swamp small signals. While this will happen to some extent, FIG. 15 suggests that even when a maximum large signal is present, e.g. eight times as large as the bias current for a 1% THD, simultaneously present small signals can still be processed as cleanly as they would with a conventional filter with a 52.5 dB DR. This might of course depend on the frequency of the large signal. Finally, FIG. 15 shows that the 30 MHz filter achieves a dynamic range DR=62.5 dB for a −40 dB THD and a maximum SNR of 52.5 dB.

For completeness, since it is standard to measure the THD at a frequency equal to ⅓ the filter's cutoff frequency, this was done with a test signal applied at 10 MHz, using the same test conditions described in the previous paragraph, For a test signal amplitude of 200 $\mu A_{peak}$, the measured THD was THD=−53 dB.

Figures 17A, 17B:
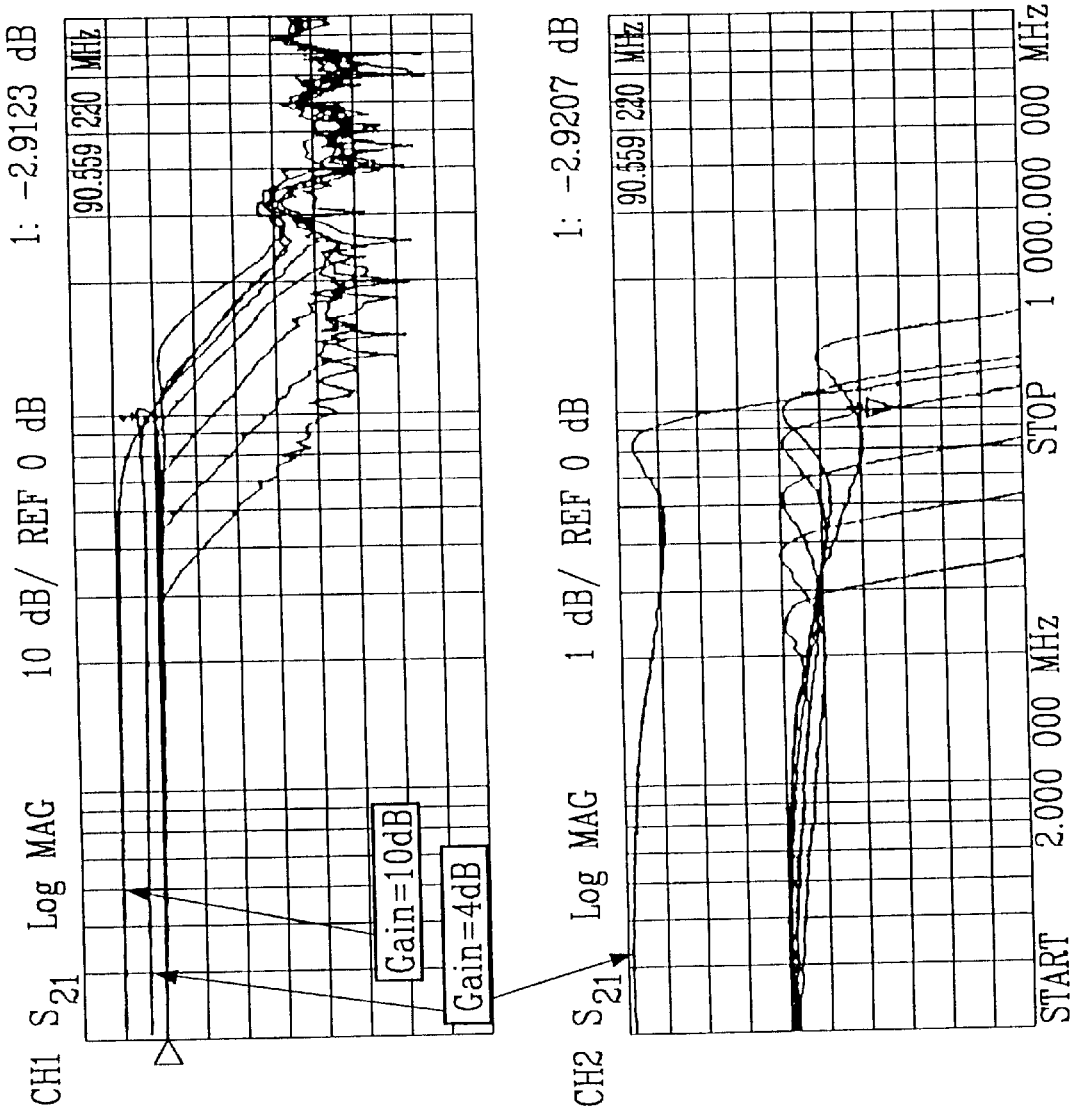
FIG. 17(a) and FIG. 17(b) illustrate the measured frequency response of the 100-MHz filter, showing frequency tunability and gain control.
Figure 18:
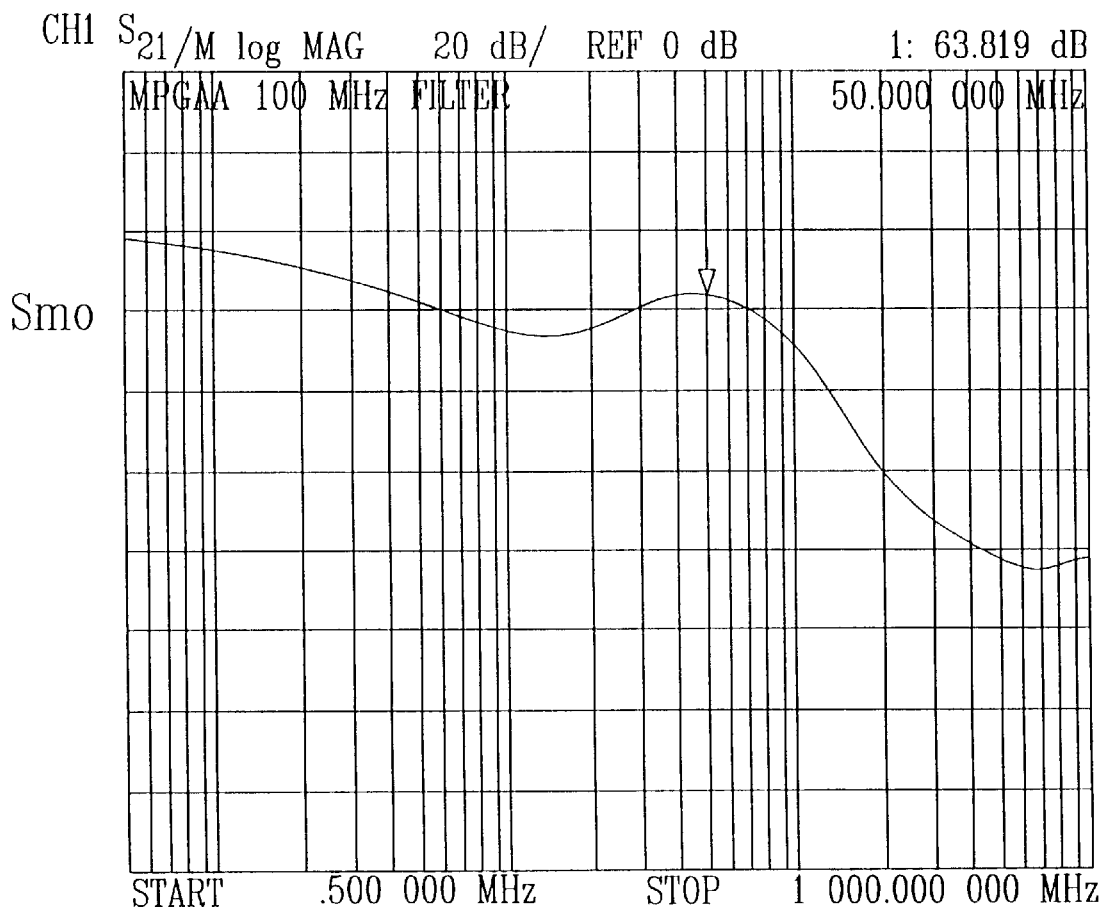
FIG. 18 illustrates the measured PSRR for the 100-MHz filter.

The frequency response of the 100 MHz filter is shown in FIG. 17. While setting the gain to 0 dB, the 3 dB cutoff frequency is tunable from 32 MHz up to 110 MHz. The gain was programmable up to +10 dB. Also, a plot of the PSRR versus frequency for this filter is shown in FIG. 18. The PSRR remains between 55 dB and 77 dB up to 50 MHz, and decreases to about 50 dB at the cutoff frequency of 100 MHz.

Figure 19A:
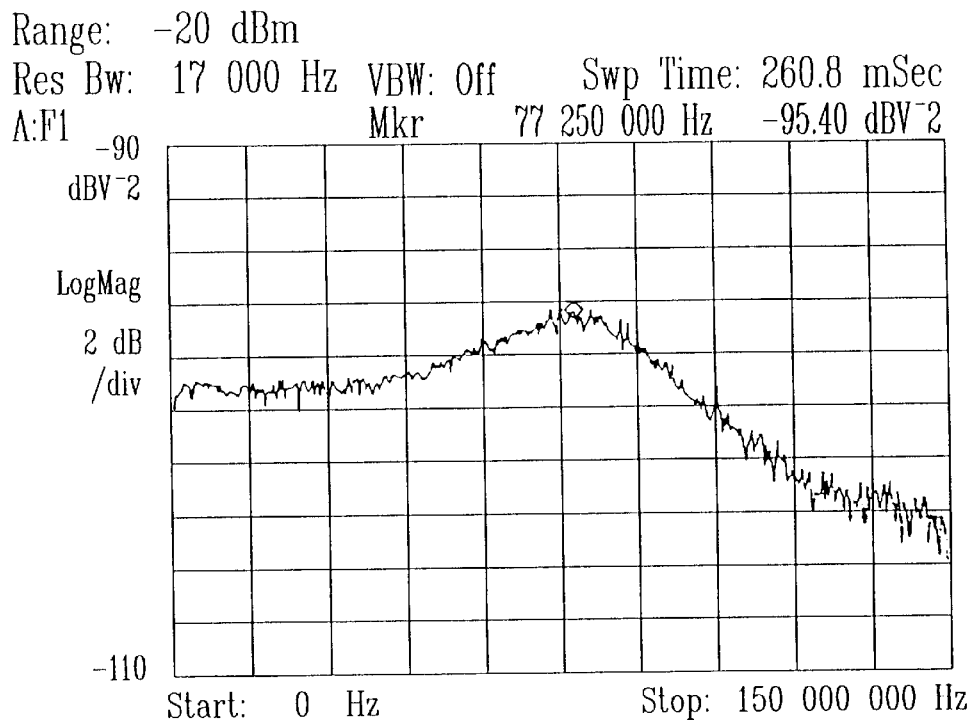
FIG. 19(a) illustrates the mean square amplified output noise of the 100-MHz filter.
Figure 19B:
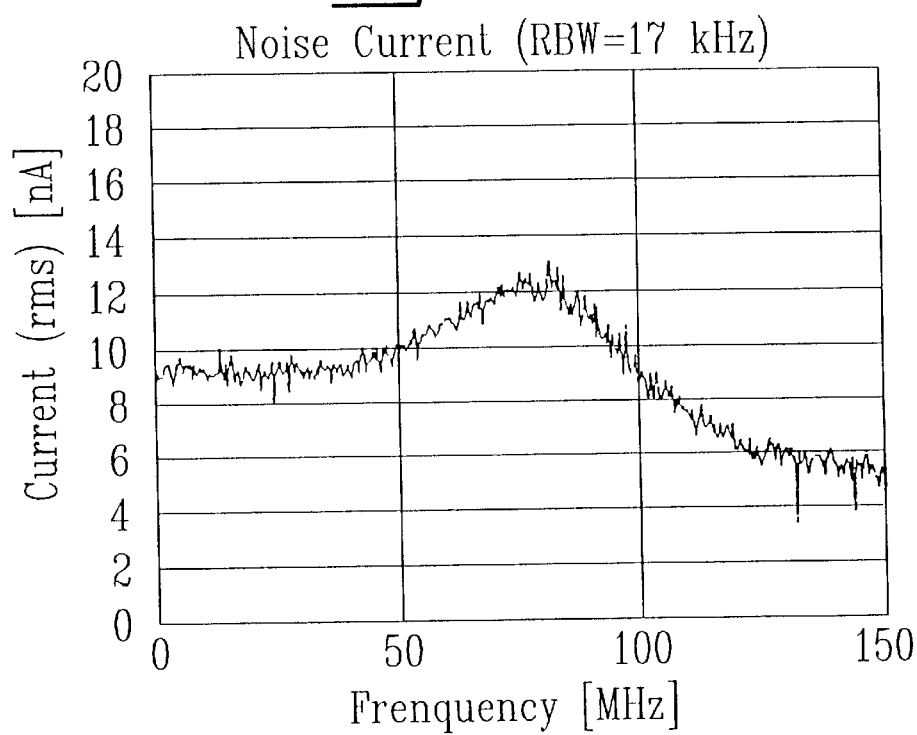
FIG. 19(b) illustrates the output noise current of the filter after post-processing the plot of FIG. 19(a).

Finally, the measured output noise of the 100 MHz filter, with no input signals applied, is shown in FIG. 19. An RF amplifier with 28 dB of gain was connected to the filter's output to measure the noise. The "Math" function of the spectrum analyzer was used to offset the excess noise introduced by this post-processing amplifier, resulting in the mean square amplified noise plot shown in FIG. 19(a). Post-processing was then conducted to compute the actual output noise current, The result is shown in FIG. 19(b), The total output noise current for the 100 MHz filter was found to be 847 $nA_{rms}$. The performances of the two filters are summarized in Table 2.

Table 2 compares the performance of the two filters described herein to the early class A prototype reported in M. N. El-Gamal, and G. W. Roberts, "A 1.2 V NPN-only log-domain integrator," in Proc, 1999 IEEE Int. Symp. Circuits and Systems, vol. 2, pp 681–684, May 1999, and to the class AB proposed in M. Punzenberger and C. C. Enz, "A 1.2 V BiCMOS class AB log-domain filter," ISSCC Dig. Tech. Papers, pp. 56–57, February 1997. The four prototypes are of the third-order Chebyshev type. Although all of the filters, except for the 100 MHz one, use capacitors in the range of 10–20 pF, their total idle output noise is different. This is due to the different biasing levels necessary to achieve different cutoff frequencies. Note that, while the noise level in the 30 MHz filter is considerably higher than that of the filter in M. Punzenberger and C. C. Enz, their DR's is comparable. This is due to the fact that the upper limit of the DR in the 30 MHz filter, which is limited by the maximum allowable distortion level, is also higher due to the higher bias current.

By extending a class A implementation to class AB (i.e. the 30 MHz filter) a considerable extension of the DR can be gained: 22 dB in this case. Finally, as is the case for conventional filters, a decrease in the size of the integrating capacitors in the quest for higher frequencies (i.e. the 100 MHz filter), will inevitably result in a decrease in the DR, for the same level of bias current.

It will be understood that numerous modifications thereto will appear to those skilled in the art. Accordingly, the above description and accompanying drawings should be taken as illustrative of the invention and not in a limiting sense.

It will further be understood that it is intended to cover any variations, uses, or adaptations of the invention following, in general, the principles of the invention and including such departures form the present disclosure as come within known or customary practice within the art to which the invention pertains and as may be applied to the essential features hereinbefore set forth, and as follows in the scope of the appended claims.

What is claimed is:

1. A log-domain integrator comprising:

a positive compressed input voltage and a negative compressed input voltage;

a positive compressed output voltage and a negative compressed output voltage;

a ground and a reference voltage;

a first capacitor and a second capacitor;

a first transistor, a second transistor, a third transistor, a fourth transistor, a fifth transistor, a sixth transistor, a seventh transistor, an eighth transistor, a ninth transistor, a tenth transistor, an eleventh transistor, a twelfth transistor, a thirteenth transistor, a fourteenth transistor;

a first current source, a second current source, a third current source, a fourth current source, a fifth current source, a sixth current source, a seventh current source, an eighth current source, a ninth current source, a tenth current source, an eleventh current source, a twelfth current source;

wherein said first capacitor is connected between the negative compressed output voltage and the ground and said second capacitor is connected between the positive compressed output voltage and the ground;

wherein an output of said first current source is connected to a collector of said first transistor, a base of said second transistor, a base of said fifth transistor and a base of said first transistor;

wherein an output of said third current source is connected to a collector of said third transistor, a base of said fourth transistor and a base of said third transistor;

wherein an output of said fifth current source is connected to a collector of said fourth transistor, a base of said eleventh transistor and a base of said twelfth transistor;

wherein an output of said seventh current source is connected to a collector of said seventh transistor, a base of said fourteenth transistor and a base of said thirteenth transistor;

wherein an output of said eleventh current source is connected to a collector of said tenth transistor, a base of said tenth transistor, a base of said sixth transistor and a base of said ninth transistor;

wherein an output of said ninth current source is connected to a collector of said eighth transistor, a base of said seventh collector and a base of said eight collector;

wherein an input of said second current source is connected to said positive compressed input voltage and an emitter of said first transistor;

wherein an input of said twelfth current source is connected to said negative compressed input voltage and an emitter of said tenth transistor;

wherein an input of said fourth current source is connected to an emitter of said third transistor, a collector of said eleventh transistor, an input of said second capacitor, said positive compressed output voltage is connected to an emitter of said second transistor;

wherein an input of said tenth current source is connected to an emitter of said eighth transistor, a collector of said fourteenth transistor, an input of said first capacitor, said negative compressed output voltage is connected to an emitter of said ninth transistor;

wherein an input of said sixth current source is connected to an emitter of said fourth transistor, a collector of said twelfth transistor and an emitter of said sixth transistor;

wherein an input of said eighth current source is connected to an emitter of said seventh transistor, a collector of said thirteenth transistor and an emitter of said fifth transistor;

wherein said ground is connected to an output of said second current source, an emitter of said eleventh transistor, an emitter of said twelfth transistor, an emitter of said thirteenth transistor, an emitter of said fourteenth transistor, an output of said fourth current source, an output of said sixth current source, an output of said eighth current source, an output of said tenth current source, an output of said twelfth current source; and wherein said reference voltage is connected to an input of said first current source, an input of said third current source, an input of said fifth current source, an input of said seventh current source, an input of said ninth current source, an input of said eleventh current source, a collector of said second transistor, a collector of said fifth transistor, a collector of said sixth transistor and a collector of said ninth transistor.

2. An integrator as claimed in claim 1, further comprising constant current sources used to compensate for finite betas of said transistors.

3. An integrator as claimed in claim 1, wherein said reference voltage is greater or equal to $V_{BE}+2\ V_{CEsat}$, wherein $V_{BE}$ is base-emitter junction drop of one transistor and $V_{CEsat}$ is a saturation voltage of one positive or negative current source.

4. An integrator as claimed in claim 1, wherein said reference voltage is 1.2 V.

5. An integrator as claimed in claim 1, wherein all transistors are of the NPN type.

6. An integrator as claimed in claim 1, further comprising a positive half of an input stage generating said positive compressed input voltage and a negative half of said input stage generating said negative compressed input voltage, said positive and said negative half of said input stage each comprising:

a first dc voltage;

a linear Voltage-to-Current Converter;

one of a positive uncompressed input voltage and a negative uncompressed input voltage;

a fifteenth current source, a sixteenth current source, a seventeenth current source, an eighteenth current source, a nineteenth current source;

a sixteenth transistor, a seventeenth transistor, an eighteenth transistor, a nineteenth transistor, a twentieth transistor, a twenty-first transistor, a twenty-second transistor, a twenty-third transistor, a twenty-fourth transistor, a twenty-fifth transistor;

wherein said first dc voltage, said reference voltage, said ground and said one of a positive uncompressed input voltage and a negative uncompressed input voltage are connected to said linear Voltage-to-Current Converter;

wherein a first output of said linear Voltage-to-Current Converter is connected to a base of said seventeenth transistor, a base of said twentieth transistor, a base of said twenty-third transistor;

wherein a second output of said linear Voltage-to-Current Converter is connected to an emitter of said sixteenth transistor, a collector of said seventeenth transistor;

wherein said first dc voltage is connected to a base of said nineteenth transistor and a base of said twenty-first transistor;

wherein said reference voltage is connected to a collector of said sixteenth transistor, an input of said fifteenth current source, a collector of said eighteenth transistor, an input of said seventeenth current source, a collector of said twenty-second transistor, an input of said nineteenth current source;

wherein said ground is connected to an emitter of said seventeenth transistor, an emitter of said twentieth transistor, an emitter of said twenty-third transistor, an emitter of said twenty-fifth transistor, an output of said sixteenth current source, an output of said eighteenth current source;

wherein an output of said fifteenth current source is connected to a collector of said eighteenth transistor, a base of said eighteenth transistor and a base of said sixteenth transistor;

wherein an emitter of said eighteenth transistor is connected to an input of said sixteenth current source, an emitter of said eighteenth transistor and a collector of said twentieth transistor;

wherein an output of said seventeenth current source is connected to a collector of said twenty-first transistor and a base of said twenty-fifth transistor;

wherein an emitter of said twenty-first transistor is connected to an input of said eighteenth current source, an emitter of said twenty-second transistor, a collector of said twenty-third transistor;

wherein an output of said nineteenth current source is connected to a collector of said twenty-fourth transistor, a base of said twenty-fourth transistor and a base of said twenty-second transistor; and wherein an emitter of said twenty-second transistor is connected to a corresponding one of said positive compressed input voltage and said negative compressed input voltage, respectively, and a collector of said twenty-fifth transistor.

7. An integrator as claimed in claim 1, farther comprising a positive half of an output post-processing stage generating a positive uncompressed output voltage and a negative half of said output post-processing stage generating a negative uncompressed output voltage, said positive and said negative half of said output post-processing stage each comprising:

a second dc voltage;

an output resistor;

a twentieth current source, a twenty-first current source, a twenty-second current source;

a twenty-sixth transistor, a twenty-seventh transistor, a twenty-eighth transistor, a twenty-ninth transistor, a thirtieth transistor;

wherein said ground is connected to an output of said twenty-first current source, an emitter of said twenty-eighth transistor, an emitter of said thirtieth transistor;

wherein said reference voltage is connected to an input of said twentieth current source, a collector of said twenty-seventh transistor, an input of said output resistor and an input of said twenty-second current source;

wherein an output of said twentieth current source is connected to a collector of said twenty-sixth transistor, a base of said twenty-sixth transistor and a base of said twenty-seventh transistor;

wherein an emitter of said twenty-sixth transistor is connected to one of said positive compressed output voltage and said negative compressed output voltage and to an input of said twenty-first current source;

wherein an emitter of said twenty-seventh transistor is connected to an emitter of said twenty-ninth transistor and a collector of said twenty-eighth transistor;

wherein an output of said twenty-second current source is connected to a collector of said twenty-ninth transistor, a base of said thirtieth transistor and a base of said twenty-eighth transistor;

wherein said base of said twenty-ninth transistor is connected to said second dc voltage; and wherein an output of said output resistor is connected to a collector of said thirtieth transistor and to a corresponding one of said uncompressed positive output voltage and said uncompressed negative output voltage, respectively.

8. An integrator as claimed in claim 6, further comprising a positive half of an output post-processing stage generating a positive uncompressed output voltage and a negative half of said output post-processing stage generating a negative uncompressed output voltage, said positive and said negative half of said output post-processing stage each comprising:

a second dc voltage;

an output resistor;

a twentieth current source, a twenty-first current source, a twenty-second current source;

a twenty-sixth transistor, a twenty-seventh transistor, a twenty-eighth transistor, a twenty-ninth transistor, a thirtieth transistor;

wherein said ground is connected to an output of said twenty-first current source, an emitter of said twenty-eighth transistor, an emitter of said thirtieth transistor;

wherein said reference voltage is connected to an input of said twentieth current source, a collector of said twenty-seventh transistor, an input of said output resistor and an input of said twenty-second current source;

wherein an output of said twentieth current source is connected to a collector of said twenty-sixth transistor, a base of said twenty-sixth transistor and a base of said twenty-seventh transistor;

wherein an emitter of said twenty-sixth transistor is connected to one of said positive compressed output voltage and said negative compressed output voltage and to an input of said twenty-first current source;

wherein an emitter of said twenty-seventh transistor is connected to an emitter of said twenty-ninth transistor and a collector of said twenty-eighth transistor;

wherein an output of said twenty-second current source is connected to a collector of said twenty-ninth transistor, a base of said thirtieth transistor and a base of said twenty-eighth transistor;

wherein said base of said twenty-ninth transistor is connected to said second dc voltage; and wherein an output of said output resistor is connected to a collector of said thirtieth transistor and to a corresponding one of said uncompressed positive output voltage and said uncompressed negative output voltage, respectively.

9. An integrator as claimed in claim 8, wherein said first dc voltage is said second dc voltage.

10. An input stage for a log-domain integrator comprising a positive half for generating a positive compressed input voltage and a negative half for generating a negative compressed input voltage, said positive and said negative half of said input stage each comprising:

a first dc voltage;

a reference voltage;

a ground;

a linear Voltage-to-Current Converter;

one of a positive uncompressed input voltage and a negative uncompressed input voltage;

a fifteenth current source, a sixteenth current source, a seventeenth current source, an eighteenth current source, a nineteenth current source;

a sixteenth transistor, a seventeenth transistor, an eighteenth transistor, a nineteenth transistor, a twentieth transistor, a twenty-first transistor, a twenty-second transistor, a twenty-third transistor, a twenty-fourth transistor, a twenty-fifth transistor;

wherein said first dc voltage, said reference voltage, said ground and said one of a positive uncompressed input voltage and a negative uncompressed input voltage are connected to said linear Voltage-to-Current Converter;

wherein a first output of said linear Voltage-to-Current Converter is connected to a base of said seventeenth transistor, a base of said twentieth transistor, a base of said twenty-third transistor;

wherein a second output of said linear Voltage-to-Current Converter is connected to an emitter of said sixteenth transistor, a collector of said seventeenth transistor;

wherein said first dc voltage is connected to a base of said nineteenth transistor and a base of said twenty-first transistor;

wherein said reference voltage is connected to a collector of said sixteenth transistor, an input of said fifteenth current source, a collector of said eighteenth transistor, an input of said seventeenth current source, a collector of said twenty-second transistor, an input of said nineteenth current source;

wherein said ground is connected to an emitter of said seventeenth transistor, an emitter of said twentieth transistor, an emitter of said twenty-third transistor, an emitter of said twenty-fifth transistor, an output of said sixteenth current source, an output of said eighteenth current source;

wherein an output of said fifteenth current source is connected to a collector of said eighteenth transistor, a base of said eighteenth transistor and a base of said sixteenth transistor;

wherein an emitter of said eighteenth transistor is connected to an input of said sixteenth current source, an emitter of said eighteenth transistor and a collector of said twentieth transistor;

wherein an output of said seventeenth current source is connected to a collector of said twenty-first transistor and a base of said twenty-fifth transistor;

wherein an emitter of said twenty-first transistor is connected to an input of said eighteenth current source, an emitter of said twenty-second transistor, a collector of said twenty-third transistor;

wherein an output of said nineteenth current source is connected to a collector of said twenty-fourth transistor, a base of said twenty-fourth transistor and a base of said twenty-second transistor; and wherein an emitter of said twenty-second transistor is connected to a corresponding one of said positive compressed input voltage and said negative compressed input voltage, respectively, and a collector of said twenty-fifth transistor.

11. An integrator as claimed in claim 6, wherein said linear Voltage-to-Current Converter comprises;

a thirteenth current source and a fourteenth current source;

a fifteenth transistor;

an input resistor;

wherein said first dc voltage is connected to a base of said fifteenth transistor;

wherein said input resistor is connected between an emitter of said fifteenth transistor and said one of said positive uncompressed input voltage and negative uncompressed input voltage;

wherein said thirteenth current source is connected between said reference voltage and a collector of said fifteenth transistor;

wherein said fourteenth current source is connected between said emitter of said fifteenth transistor and said ground;

wherein said first output of said linear Voltage-to-Current Converter is connected to said collector of said fifteenth transistor; and wherein said second output of said linear Voltage-to-Current Converter is connected to said emitter of said fifteenth transistor.

12. An input stage as claimed in claim 10, wherein said linear Voltage-to-Current Converter comprises:

a thirteenth current source and a fourteenth current source;

a fifteenth transistor;

an input resistor;

wherein said first dc voltage is connected to a base of said fifteenth transistor;

wherein said input resistor is connected between an emitter of said fifteenth transistor and said one of said positive uncompressed input voltage and negative uncompressed input voltage;

wherein said thirteenth current source is connected between said reference voltage and a collector of said fifteenth transistor;

wherein said fourteenth current source is connected between said emitter of said fifteenth transistor and said ground;

wherein said first output of said linear Voltage-to-Current Converter is connected to said collector of said fifteenth transistor; and wherein said second output of said linear Voltage-to-Current Converter is connected to said emitter of said fifteenth transistor.

* * * * *